US012635487B2

(12) United States Patent
Zou et al.

(10) Patent No.: US 12,635,487 B2
(45) Date of Patent: May 19, 2026

(54) SEMICONDUCTOR BACKSIDE ISOLATION FEATURE FOR MERGED EPITAXY

(71) Applicant: International Business Machines Corporation, Armonk, NY (US)

(72) Inventors: Lijuan Zou, Slingerlands, NY (US); Tao Li, Slingerlands, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 18/336,063

(22) Filed: Jun. 16, 2023

(65) Prior Publication Data

US 2024/0420990 A1　Dec. 19, 2024

(51) Int. Cl.
　*H01L 21/762*　(2006.01)
　*H10D 86/00*　(2025.01)
　*H10D 86/01*　(2025.01)

(52) U.S. Cl.
　CPC ....... *H01L 21/76224* (2013.01); *H10D 86/00* (2025.01); *H10D 86/01* (2025.01)

(58) Field of Classification Search
　CPC ........ H01L 21/76224; H01L 21/76232; H10D 84/0149; H10D 84/0186; H10D 84/0188; H10D 84/0151
　See application file for complete search history.

(56) References Cited

U.S. PATENT DOCUMENTS 9,543,397 B2　1/2017　Kleemeier
11,177,343 B2　11/2021　Gan 11,437,283 B2　9/2022　Lilak
11,621,197 B2 *　4/2023　Su ........................ H10D 62/121
　　　　　　　　257/288
11,855,079 B2 *　12/2023　Chiang ............. H01L 21/76224
11,894,436 B2 *　2/2024　Frougier ............. H10D 30/014
12,057,341 B2 *　8/2024　Chen .................... H01L 21/764
2022/0254925 A1　8/2022　Gardner
2022/0262915 A1　8/2022　Su et al.
(Continued)

FOREIGN PATENT DOCUMENTS

EP　　　4135052 A1　　2/2023
KR　　2021-0132587 A　　11/2021

OTHER PUBLICATIONS

Intellectual Property Office, "Request for the Submission of an Opinion," Nov. 13, 2025, 11 Pages, KR Application No. 10-2025-7015167.

(Continued)

*Primary Examiner* — Bac H Au

(74) *Attorney, Agent, or Firm* — Samuel A. Waldbaum

(57) ABSTRACT

A semiconductor structure includes a front-end-of-line level including a plurality of field effect transistors. Each field effect transistor includes source/drain regions located on opposite sides of the field effect transistors. A shallow trench isolation region located between adjacent field effect transistors electrically separates the plurality of field effect transistors from one another. The shallow trench isolation region has a tapered profile. A backside isolation region is embedded within the shallow trench isolation region and cuts through the source/drain regions. The backside isolation region has a reverse tapered profile.

12 Claims, 24 Drawing Sheets

(56)              References Cited

U.S. PATENT DOCUMENTS

| | | | |
|---|---|---|---|
| 2022/0271139 A1* | 8/2022 | Su | H10D 30/6735 |
| 2022/0352074 A1 | 11/2022 | Chen | |
| 2022/0352150 A1 | 11/2022 | Chiang et al. | |
| 2022/0384250 A1* | 12/2022 | Huang | H10D 62/121 |
| 2022/0392896 A1 | 12/2022 | Guler | |
| 2023/0047194 A1 | 2/2023 | Chen | |
| 2023/0093101 A1 | 3/2023 | Xie | |
| 2023/0178620 A1 | 6/2023 | Frougier et al. | |

OTHER PUBLICATIONS

International Searching Authority, "Notification of Transmittal of the International Search Report and the Written Opinion of the International Searching Authority, or Declaration," Patent Cooperation Treaty, Aug. 5, 2024 11 pages, International Application No. PCT/EP2024/063915.

\* cited by examiner

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

Section X

Section Y2

Section Y1

SEMICONDUCTOR BACKSIDE ISOLATION FEATURE FOR MERGED EPITAXY

BACKGROUND

The present invention generally relates to the field of semiconductor devices, and more particularly to power delivery to active devices.

Modern integrated circuits (IC) are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer ($M_0$ or $M_1$) may include a plurality of metal lines such as VDD power rails and VSS power rails.

As ICs continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops. However, with increased scaling, merger of epitaxially grown structures ("epi merge") at tight spaces can be difficult to avoid. Thus, there is a need for improved processing sequences and methods to form backside interconnects in the presence of merged epitaxy features.

SUMMARY

According to an embodiment of the present disclosure, a semiconductor structure includes a front-end-of-line level including a plurality of field effect transistors, each field effect transistor including source/drain regions located on opposite sides of the field effect transistors, a shallow trench isolation region located between adjacent field effect transistors for electrically separating the plurality of field effect transistors from one another, the shallow trench isolation region having a tapered profile, and a backside isolation region embedded within the shallow trench isolation region and cutting through the source/drain regions, the backside isolation region having a reverse tapered profile.

In one or more embodiments, the backside isolation region having the reverse tapered profile includes a top portion of the backside isolation region embedded within the source/drain regions having a first critical dimension, and a bottom portion of the backside isolation region embedded within the shallow trench isolation region having a second critical dimension, with the second critical dimension being larger than the first critical dimension.

According to another embodiment of the present disclosure, a method of forming a semiconductor structure includes forming a front-end-of-line level including a plurality of field effect transistor, each field effect transistor including source/drain regions deposited on opposite sides of the field effect transistors, forming a shallow trench isolation region between adjacent field effect transistors for electrically separating the plurality of field effect transistors from one another, the shallow trench isolation region having a tapered profile, and forming a backside isolation region embedded within the shallow trench isolation region and cutting through the source/drain regions, the backside isolation region having a reverse tapered profile.

In one or more embodiments, a top portion of the backside isolation region is embedded within the source/drain regions and has a first critical dimension, and a bottom portion of the backside isolation region is embedded within the shallow trench isolation region and has a second critical dimension, with the second critical dimension being larger than the first critical dimension.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figures 1, 2A:
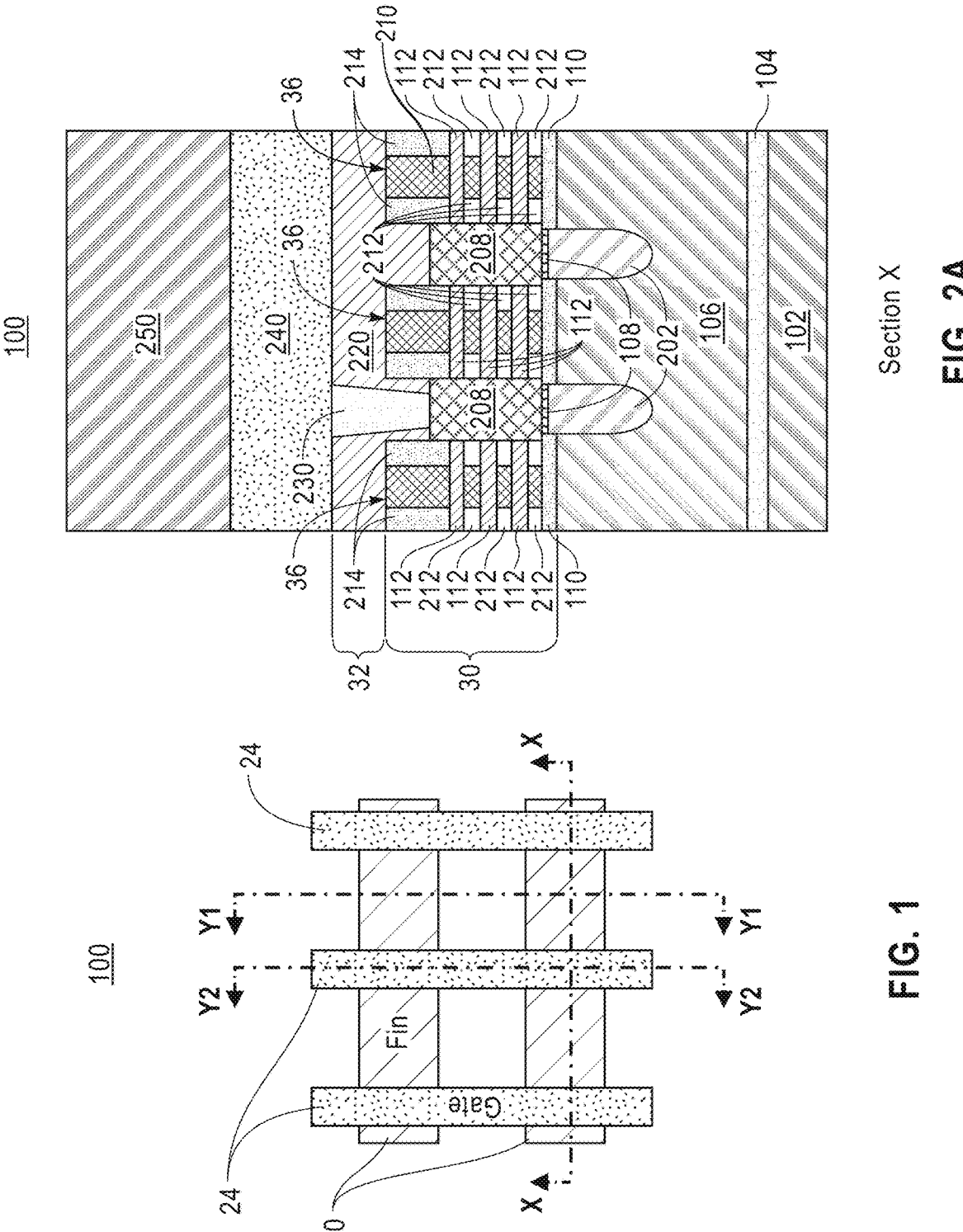
FIG. 1 is a top-down view of a semiconductor structure at an intermediate step during a semiconductor manufacturing process depicting different cross-sectional views used to describe embodiments of the present disclosure.
FIG. 2A is a cross-sectional view of the semiconductor structure taken along line X-X, as depicted in FIG. 1, shown after forming a front-end-of-line level, a middle-of-line level, a back-end-of-line level and conducting carrier wafer bonding, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

As transistor dimensions continue to scale downward in size, merger of source and drain epitaxial features of neighboring FET transistors becomes difficult to avoid. However, in some cases, when merger is avoided, the source and drain epitaxial features may be insufficiently separated, leading to undesirable parasitic capacitance between lateral sidewalls of the neighboring source and drain epitaxial features. Thus, source and drain epitaxial features may be formed to merge intentionally, with the expectation that the merged features will be separated in a subsequent processing step.

Therefore, embodiments of the present disclosure provide a method for forming a semiconductor structure in which merged epitaxial features are separated by a self-aligned source/drain isolation region formed using backside processes. In the following described embodiments, the self-aligned backside dielectric feature (i.e., backside isolation region) cuts through source/drain regions and shallow trench isolation regions located between two adjacent field effect transistors for electrically isolating the source/drain regions. In one or more embodiments, the self-aligned backside isolation region has a first critical dimension (CD1) near the source/drain epi top and gate region substantially smaller than a second critical dimension (CD2) located near a bottom portion of the shallow trench isolation region. In one or more embodiments, the self-aligned backside isolation region is, at least partially, in contact with a gate cut in the gate region of the semiconductor structure. Preferably, a backside of at least one source/drain epi region is electrically connected to a backside self-aligned contact, while a backside of another source/drain region electrically connected to a middle-of-line contact is in contact with a placeholder layer.

Embodiments of the present disclosure use tapered shallow trench isolation regions to perform self-aligned backside source/drain cut with the source/drain cut having different critical dimensions at bottom and top regions. As cell height continues to scale and the space between FETs becomes tighter. The smaller top critical dimension of the source/drain cut takes less space and addresses this concern. A placeholder everywhere approach is used together with EUV patterning for forming the placeholder layers. An advantage of the placeholder everywhere approach includes assuring uniform epitaxial growth of source/drain regions and placeholder layers across different FETs.

Embodiments by which the semiconductor structure having a backside source/drain isolation region can be formed is described in detailed below by referring to the accompanying drawings in FIGS. 1-13C.

Referring now to FIG. 1, a top-down view of a semiconductor structure 100 is shown at an intermediate step during a semiconductor manufacturing process, according to an embodiment of the present disclosure. Particularly, FIG. 1 depicts different cross-sectional views of the semiconductor structure 100 that will be used to describe embodiments of the present disclosure. The cross-sectional views are taken along line X-X, line Y1-Y1 and line Y2-Y2. As depicted in the figure, line X-X represents a cut along a nanosheet fin structure or nanosheet fin region 20 of the semiconductor structure 100, line Y1-Y1 represents a cut across the nanosheet fin structure or nanosheet fin region 20, and line Y2-Y2 represents a cut along a gate structure or gate region 24 of the semiconductor structure 100. For illustration purposes only, without intent of limitation, FIG. 1 is a simplified version of the semiconductor structure 100 and may not include detailed features of the particular manufacturing step.

Figures 2B, 2C:
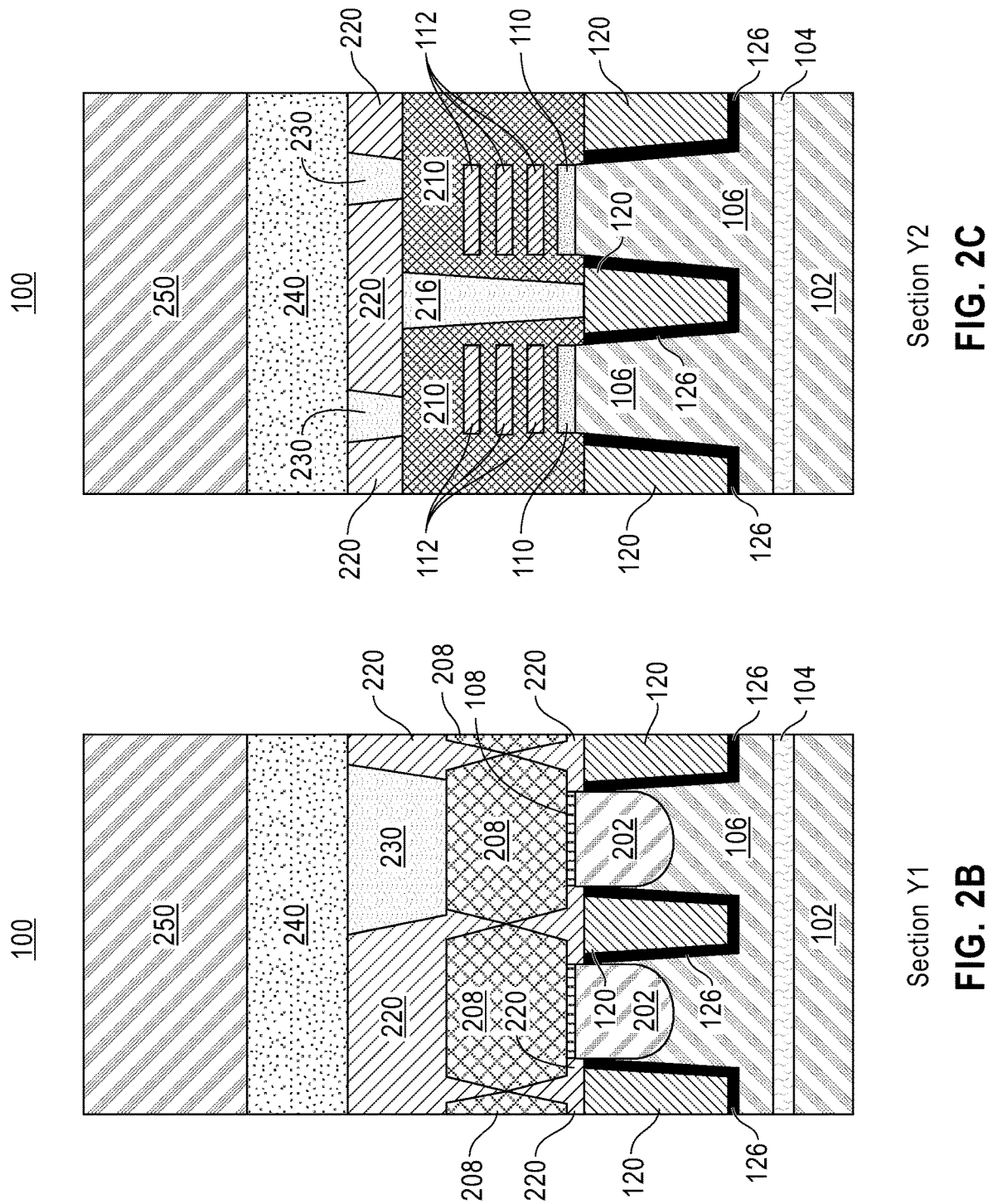
FIG. 2B is a cross-sectional view of the semiconductor structure taken along line Y1-Y1 as depicted in FIG. 1.
FIG. 2C is a cross-sectional view of the semiconductor structure taken along line Y2-Y2 as depicted in FIG. 1.

Referring now to FIGS. 2A-2C, cross-sectional views of the semiconductor structure 100 are shown after completing a front-end-of-line (FEOL) level 30, a middle-of-line (MOL) level 32, a back-end-of-line (BEOL) level 240 and conducting carrier wafer bonding. In this embodiment, FIG. 2A is a cross-sectional view of the semiconductor structure 100 taken along line X-X as depicted in FIG. 1, FIG. 2B is a cross-sectional view of the semiconductor structure 100 taken along line Y1-Y1 as depicted in FIG. 1, and FIG. 2C is a cross-sectional view of the semiconductor structure 100 taken along line Y2-Y2 as depicted in FIG. 1.

As known by those skilled in the art, in contemporary semiconductor device fabrication processes a large number of semiconductor devices, such as field effect transistors (FETs), are fabricated on a single wafer. Some non-planar device architectures, including nanosheet FETs, provide increased device density and increased performance over planar devices. In nanosheet FETs, in contrast to conventional FETs, the gate stack wraps around the full perimeter of each nanosheet, enabling fuller depletion in the channel region, and reducing short-channel effects. The wrap-around gate structures used in nanosheet devices also enable greater management of leakage current in the active regions, even as drive currents increase.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanosheets or nanowires. The nanosheets or nanowires can be used to form gate-all-around devices.

According to an embodiment, known semiconductor fabrication operations have been used to form the semiconductor structure 100 as depicted in FIGS. 2A-2C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the depicted embodiment, the semiconductor structure 100 includes a substrate 102, a first sacrificial layer 104 located above the substrate 102, and a first semiconductor layer 106 deposited above the first sacrificial layer 104. According to an embodiment, the first sacrificial layer 104 and the first semiconductor layer 106 are vertically stacked one on top of another in a direction perpendicular to the substrate 102, as illustrated in the figures.

The substrate 102 may be, for example, a bulk substrate, which may be made from any of several known semiconductor materials such as, for example, silicon, germanium, silicon-germanium alloy, and compound (e.g., III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

The first sacrificial layer 104, can be formed on the substrate 102 using an epitaxial growth process. For instance, in the described embodiment, the first sacrificial layer 104 is formed by epitaxially growing a layer of SiGe with a germanium concentration varying from approximately 15 atomic percent to approximately 35 atomic percent. In some embodiments, the first sacrificial layer 104 can be made of epitaxially grown SiGe with a germanium concentration of approximately 30 atomic percent. In one or more embodiments, the first sacrificial layer 104 may act as an etch stop layer during subsequent substrate removal. Similarly, the first semiconductor layer 106 is formed by epitaxially growing a Si layer to a thickness varying from approximately 30 nm to approximately 250 nm, although other thicknesses are within the contemplated scope of the invention. In some embodiments, the first sacrificial layer 104 may include $SiO_2$. In such embodiments, the combined structure formed by the substrate 102, the first sacrificial layer 104, and the first semiconductor layer 106 can be an SOI wafer, with the first sacrificial layer 104 being the buried oxide (BOX) including a thickness ranging from approximately 20 nm to approximately 100 nm, and ranges therebetween. The term sacrificial, as used herein, means a layer or other structure, that is (or a part thereof is) removed before completion of the final device.

In general, the first sacrificial layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultrahigh vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first sacrificial layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

The semiconductor structure 100 further includes a plurality of field effect transistors (FETs) or nanostructure devices 36 formed above the first semiconductor layer 106. According to an embodiment, the nanostructure devices 36 may include gate-all-around (GAA) devices. In some embodiments, the nanostructure devices 36 may include at least one of an NFET device or a PFET device. In some embodiments, the nanostructure devices 36 may include only NFET devices. In yet other embodiments, the nanostructure devices 36 may include only PFET devices.

Each of the nanostructure devices 36 include semiconductor channel layers 112. In the nanostructure devices 36 shown in FIG. 2A, the semiconductor channel layers 112 are laterally abutted by source/drain regions 208 and surrounded by a gate structure 210. The gate structure 210 controls flow of electrical current through the semiconductor channel layers 112 based on voltages applied at the gate structure 210 and at the source/drain regions 208.

In the depicted embodiment, the semiconductor channel layers 112 are formed by epitaxially growing a Si layer to a thickness varying from approximately 6 nm to approximately 12 nm, although other thicknesses are within the contemplated scope of the invention. In other embodiments, the semiconductor channel layers 112 may include silicon germanium, silicon carbide, silicon carbon phosphide or another suitable semiconductor material. In embodiments in which the nanostructure devices 36 are NFET devices, the source/drain regions 208 may include, for example, phosphorous-doped silicon (Si:P) or another suitable material. In embodiments in which the nanostructure devices 36 are PFET devices, the source/drain regions 208 may include, for example, silicon-germanium (SiGe) or another suitable material.

The gate structure 210 (i.e., replacement gate) is deposited above and between the semiconductor channel layers 112. The gate structure 210 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). The gate structure 210 surrounds the semiconductor channel layers 112. In some embodiments, a gate cap (not shown) may be formed above the gate structure 210.

The nanostructure devices 36 also include gate spacers 212 deposited on sidewalls of the gate structure 210 and inner spacers 214 deposited between the semiconductor channel layers 112. The gate spacers 212 and the inner spacers 214 may include a dielectric material including, for example, a low-k material such as SiOCN, SiON, SiN, or SiOC.

In one or more embodiments, the spacer material deposited between a bottom surface of a nanostructure device 36 and the first semiconductor layer 106 can be referred to as a bottom dielectric isolation layer 110. In some embodiments, the bottom dielectric isolation layer 110 and the gate spacers 212 may be composed of different materials.

It should be noted that, in one or more embodiments, a gate cut process can be conducted on the semiconductor structure 100 for isolating gate structures 210 corresponding to different CMOS cells. During the process, a gate cut region 216 can be formed either before replacement metal gate (RMG) or after RMG, and then filled with dielectrics such as $SiO_2$, SiN, SiBCN, SiOCN, SiOC, SiC, and the like, as depicted in FIG. 2C.

The semiconductor structure 100 further includes an interlevel dielectric layer 220 deposited above nanostructure device 36. The interlevel dielectric layer 220 covers an uppermost surface of the source/drain regions 208 located between adjacent nanostructure devices 36 and surrounds a plurality of conductive structures or metal contacts 230. The interlevel dielectric layer 220 fills voids and electrically isolates active regions within the semiconductor structure

100. The interlevel dielectric layer 220 may be formed by conformal deposition (e.g., CVD) of a dielectric material. Non-limiting examples of dielectric materials to form the interlevel dielectric layer 220 may include silicon oxide, silicon nitride, hydrogenated silicon carbon oxide, silicon based low-k dielectrics, flowable oxides, porous dielectrics, or organic dielectrics including porous organic dielectrics.

According to an embodiment, metal contacts 230 are formed in the semiconductor structure 100 for electrically connecting FEOL devices (i.e., nanostructure devices 36) to subsequently formed metal levels. The process of forming the metal contacts 230 is standard and well-known in the art. Typically, the process includes forming trenches (not shown) within the interlevel dielectric layer 220 and subsequently filling the trenches with a conductive material or a combination of conductive materials to form the metal contacts 230. In one or more embodiments, the conductive material filling the metal contacts 230 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. In the depicted example, metal contacts 230 include source/drain contacts that extend until an uppermost surface of the source/drain regions 208 and gate contacts to the gate structure 210.

According to an embodiment, the semiconductor structure 100 further includes a placeholder layer 202 formed within the first semiconductor layer 106 and deposited between adjacent nanostructure devices 36. The placeholder layer 202 is formed below each of the source/drain regions 208 (i.e., placeholder everywhere approach). In one or more embodiments, EUV lithography followed by deposition of a placeholder material can be used to form the placeholder layer 202 within the first semiconductor layer 106. The placeholder layer 202 acts, as implied by the name, as placeholder for subsequently formed backside metal contacts. The material forming the placeholder layer 202 may include, for example, SiGe, AlOx, TiOx, and the like. In some embodiments, a top surface of the placeholder layer 202 can be coplanar with a top surface of the bottom dielectric isolation layer 110. In other embodiments, a buffer layer 108 typically made of silicon (Si) can be formed between source/drain regions 208 and the underlying placeholder layer 202. In these embodiments, a top surface of the buffer layer 108 is coplanar with the top surface of the bottom dielectric isolation layer 110, as shown in FIG. 2A. The buffer layer 108 ensures that source/drain regions 208 (e.g., PFET source/drain SiGe epitaxy) are separated from the placeholder layer 202 (SiGe) epitaxy.

The semiconductor structure 100 further includes shallow trench isolation (STI) regions 120 surrounded by an STI liner 126. The method of forming the STI regions 120 and STI liner 126 is standard and well-known in the art, it typically involves depositing an insulating material to substantially fill a plurality of trenches (not shown) created after processing steps in which portions of the first semiconductor layer 106 located between adjacent nanostructure devices 36 are removed from the semiconductor structure 100. According to an embodiment, the STI regions 120 and STI liner 126 electrically isolate the nanostructure devices 36 from one another. The STI regions 120 and STI liner 126 may be formed by, for example, CVD of dielectric materials. Non-limiting examples of dielectric materials to form the STI regions 120 include silicon oxide, silicon nitride, hydrogenated silicon carbon oxide, silicon based low-k dielectrics, flowable oxides, porous dielectrics, or organic dielectrics including porous organic dielectrics. In one or more embodiments, the STI liner 126 may include a nitride material. In another embodiment, the STI liner 126 may include an oxide material. In yet another embodiment, the STI liner 126 may include a bi-layer STI liner composed of a nitride liner and an underlying oxide liner.

Figure 5A:
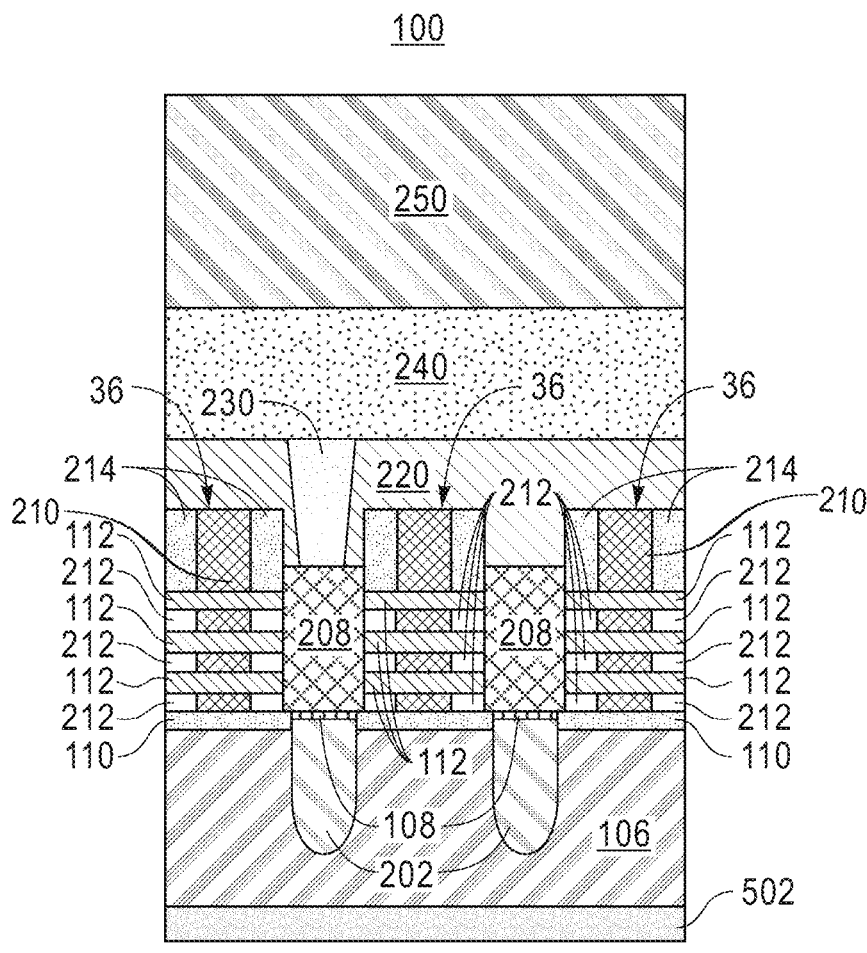
FIG. 5A is a cross-sectional view of the semiconductor structure taken along line X-X, as depicted in FIG. 1, shown after forming a dielectric cap, according to an embodiment of the present disclosure.
Figures 5B, 5C:
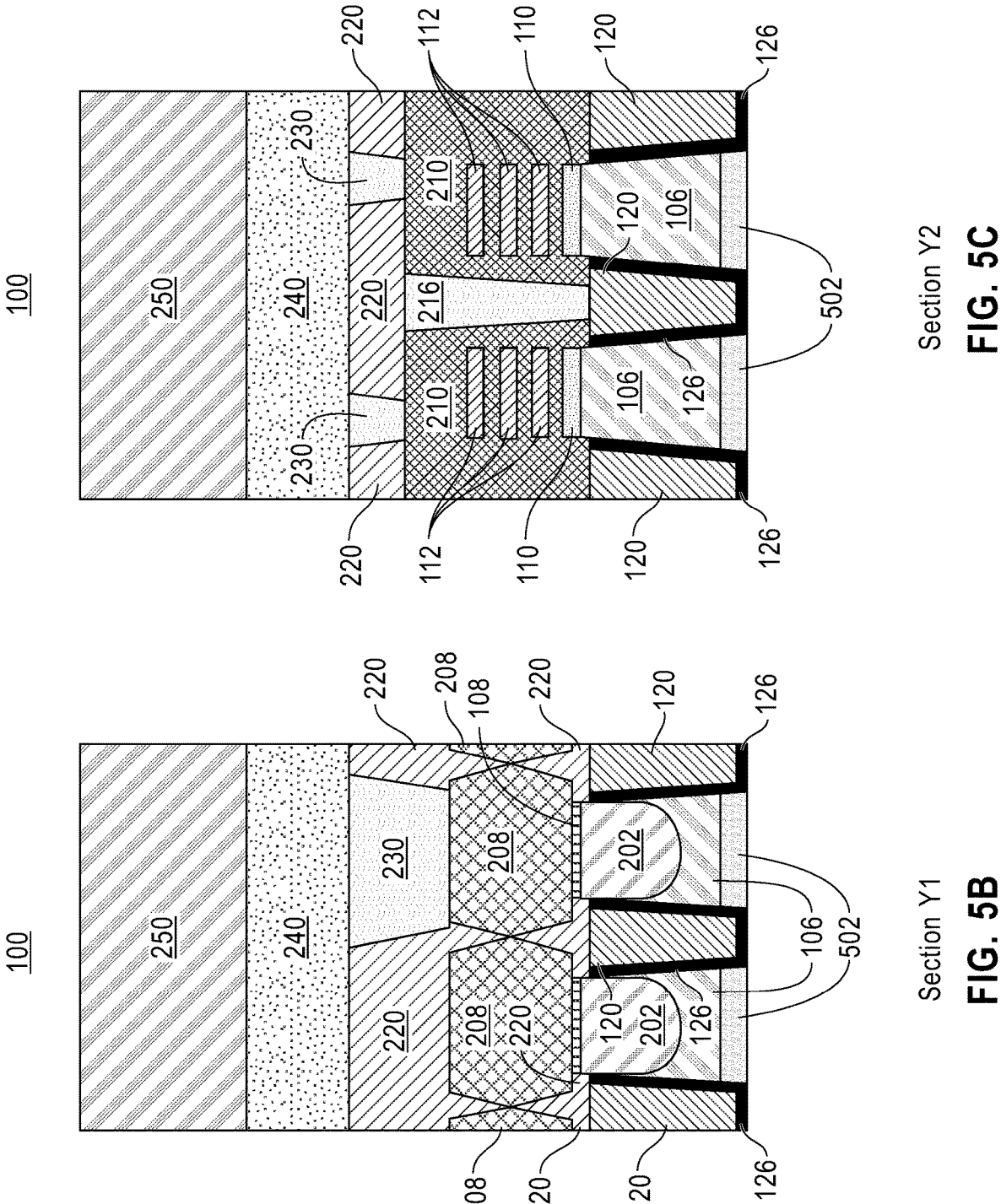
FIG. 5B is a cross-sectional view of the semiconductor structure taken along line Y1-Y1 as depicted in FIG. 1.
FIG. 5C is a cross-sectional view of the semiconductor structure taken along line Y2-Y2 as depicted in FIG. 1.

It should be noted that in the proposed embodiments the STI regions 120 are formed with a tapered profile as depicted in FIGS. 5B-5C. The tapered STI regions 120 allows forming self-aligned backside isolation regions in the semiconductor structure 100, as will be described in detail below.

In the depicted embodiment, the semiconductor structure 100 further includes the BEOL interconnect level 240, which is formed above, and electrically connected to, the FEOL device level 30. Although not depicted in the figures, the BEOL interconnect level 240 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 240, the semiconductor structure 100 (i.e., the semiconductor wafer) is bonded to the carrier wafer (or auxiliary substrate) 250. The carrier wafer 250 may act as a reinforcing substrate for providing mechanical strength during processing (e g., thinning) of the semiconductor wafer. The process of bonding the semiconductor wafer to the carrier wafer 250 can be achieved by conventional wafer bonding process, such as dielectric-to-dielectric bonding or Cu-to-Cu bonding.

Accordingly, the carrier wafer 250 may include silicon oxide layers or SiCN layers, or any other layers applicable in the direct bonding technology applied in state-of-the-art packaging techniques. Bonding of the device wafer to the carrier wafer 250 takes place by such known direct bonding techniques, thus obtaining the assembly shown in FIGS. 2A-2C. Although not depicted in the figures, after bonding of the device wafer to the carrier wafer 250 the wafer is flipped.

Figure 3A:
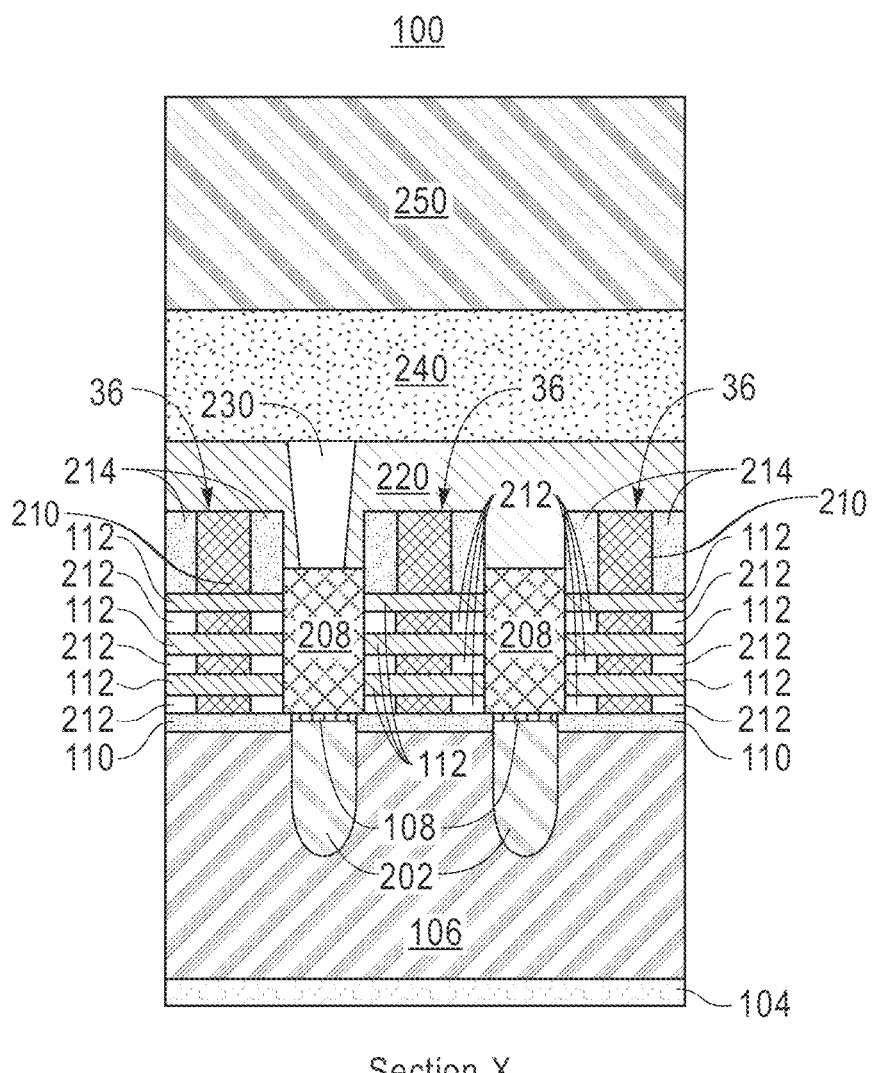
FIG. 3A is a cross-sectional view of the semiconductor structure taken along line X-X, as depicted in FIG. 1, shown after removing a substrate, according to an embodiment of the present disclosure.
Figures 3B, 3C:
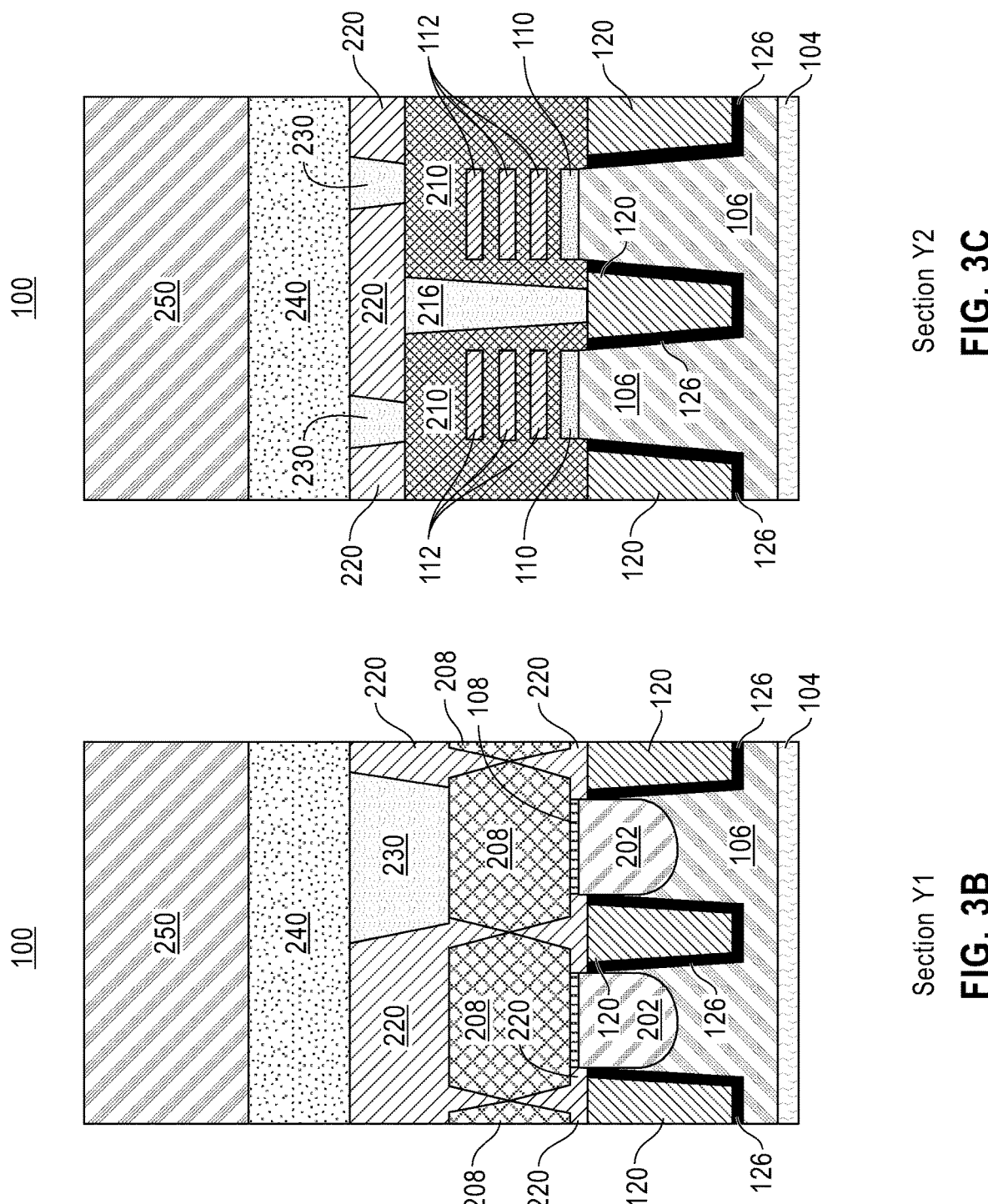
FIG. 3B is a cross-sectional view of the semiconductor structure taken along line Y1-Y1, as depicted in FIG. 1.
FIG. 3C is a cross-sectional view of the semiconductor structure taken along line Y2-Y2, as depicted in FIG. 1.

Referring now to FIGS. 3A-3C, cross-sectional views of the semiconductor structure 100 are shown after removing the substrate 102 (FIGS. 2A-2C), according to an embodiment of the present disclosure. In this embodiment, FIG. 3A is a cross-sectional view of the semiconductor structure 100 taken along line X-X as depicted in FIG. 1, FIG. 3B is a cross-sectional view of the semiconductor structure 100 taken along line Y1-Y1 as depicted in FIG. 1, and FIG. 3C is a cross-sectional view of the semiconductor structure 100 taken along line Y2-Y2 as depicted in FIG. 1.

In the depicted embodiment, after the wafer is flipped (not shown), the substrate 102 (FIGS. 2A-2C) can be removed using regular grinding. CMP and selective etching processes including wet or dry etching techniques. In one or more embodiments, the grinding process is conducted until substantially removing the substrate 102 from the semiconductor structure 100 and only a few microns of Si remain. After that, an optional CMP process can be further used to reduce the thickness variation, and finally a highly selective Si etching process is used to remove the remaining substrate 102 from the semiconductor structure 100 selective to the first sacrificial layer 104. In the depicted embodiment, the first sacrificial layer 104 act as an etch stop during the highly selective Si removal process, preventing excessive Si etch which may damage the gate structures 210 and source/drain regions 208.

Figure 4A:
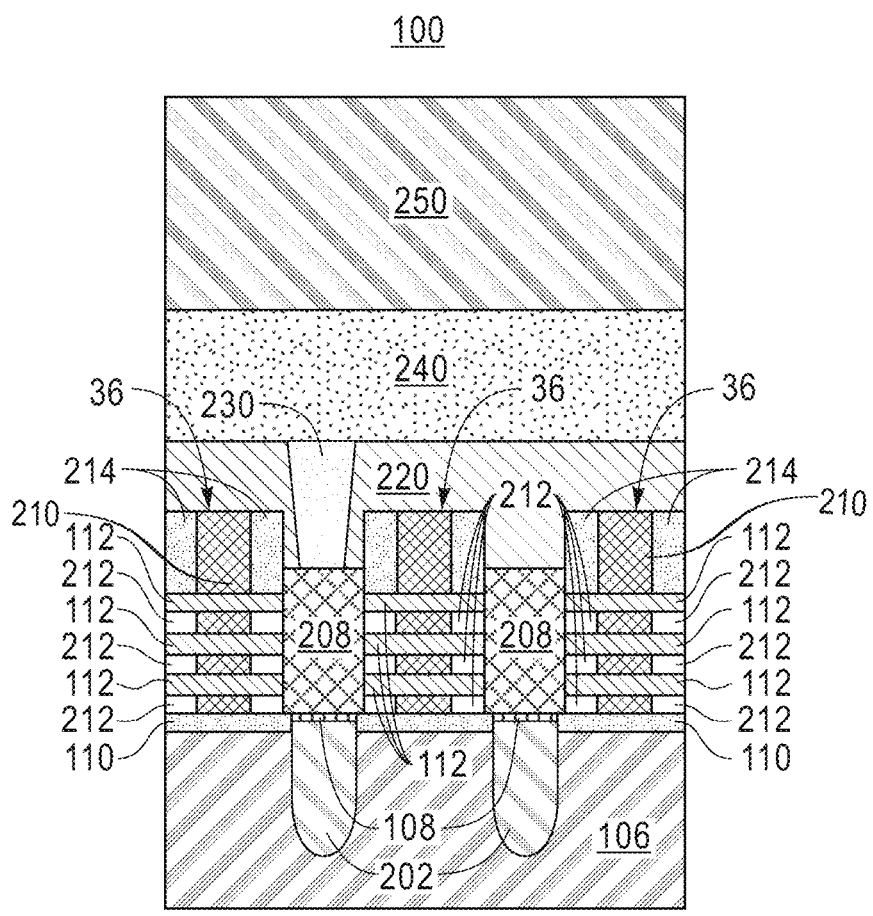
FIG. 4A is a cross-sectional view of the semiconductor structure taken along line X-X, as depicted in FIG. 1, shown after removing a first sacrificial layer and recessing remaining Si-containing areas, according to an embodiment of the present disclosure.
Figures 4B, 4C:
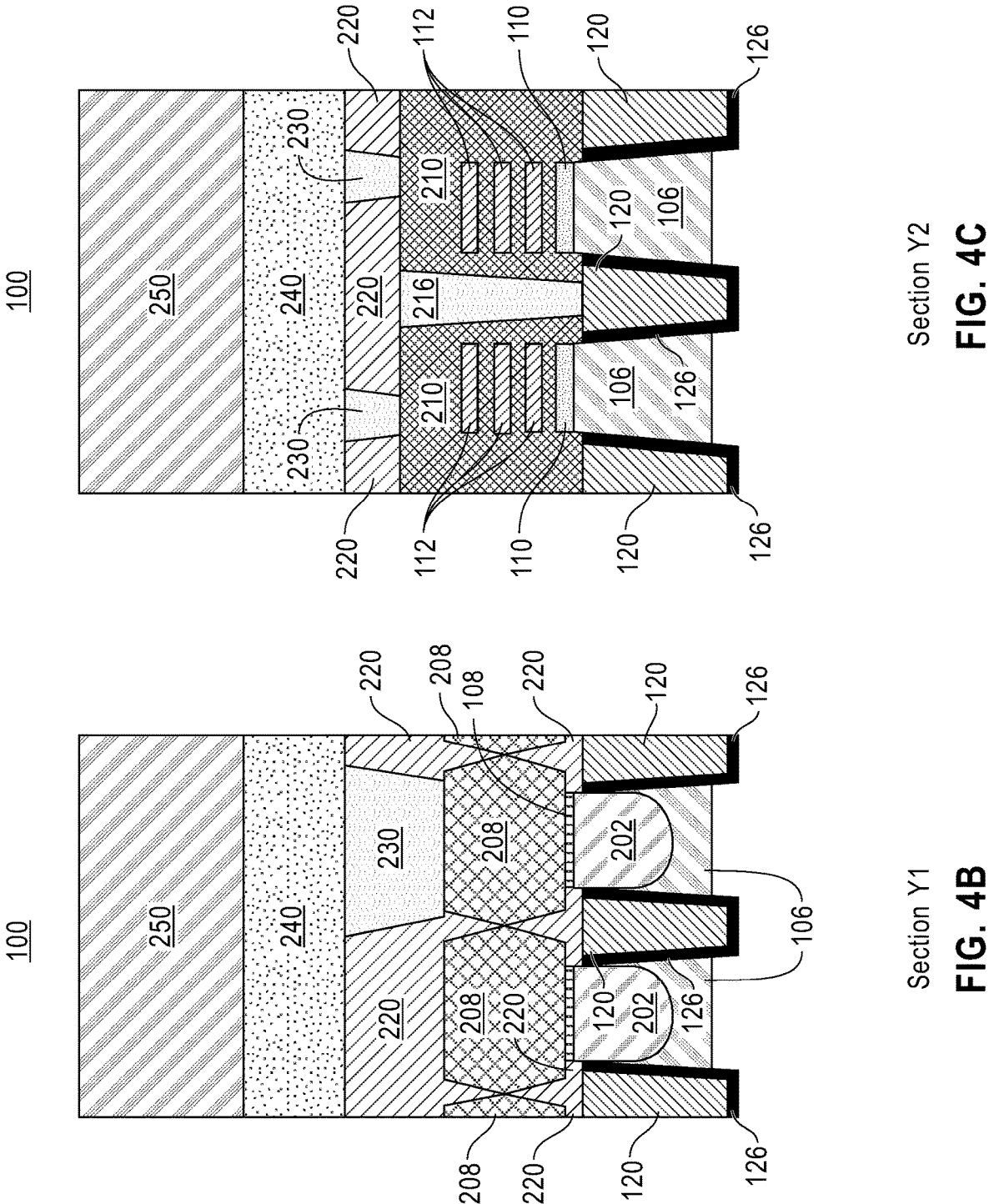
FIG. 4B is a cross-sectional view of the semiconductor structure taken along line Y1-Y1 as depicted in FIG. 1.
FIG. 4C is a cross-sectional view of the semiconductor structure taken along line Y2-Y2 as depicted in FIG. 1.

Referring now to FIGS. 4A-4C, cross-sectional views of the semiconductor structure 100 are shown after removing the first sacrificial layer 104 and recessing remaining Si-containing areas (i.e., the first semiconductor layer 106), according to an embodiment of the present disclosure. In this embodiment, FIG. 4A is a cross-sectional view of the semiconductor structure 100 taken along line X-X as depicted in FIG. 1, FIG. 4B is a cross-sectional view of the semiconductor structure 100 taken along line Y1-Y1 as depicted in FIG. 1, and FIG. 4C is a cross-sectional view of the semiconductor structure 100 taken along line Y2-Y2 as depicted in FIG. 1.

Any suitable etching technique may be used to remove the first sacrificial layer 104 (FIGS. 3A-3C) selective to the first semiconductor layer 106. In embodiments in which the first sacrificial layer 104 (FIGS. 3A-3C) is made of SiGe a hot SCl or dry HCl etch can be used to remove the first sacrificial layer 104. In embodiments in which the first sacrificial layer 104 (FIGS. 3A-3C) is made of $SiO_2$. DHF wet clean can be used to remove the first sacrificial layer 104 from the semiconductor structure 100.

In one or more embodiments, following the removal of the first sacrificial layer 104, a highly selective Si etching process can be conducted to recess the first semiconductor layer 106 without damaging the STI liner 126 and STI regions 120. As depicted in FIGS. 4B-4C, selectively recessing the first semiconductor layer 106 exposes a lowermost portion of the STI liner 126 opposing an uppermost portion of the STI liner 126/STI regions 120 in contact with the gate structures 210, as can be observed in FIG. 4C.

Referring now to FIGS. 5A-5C, cross-sectional views of the semiconductor structure 100 are shown after forming a dielectric cap 502, according to an embodiment of the present disclosure. In this embodiment, FIG. 5A is a cross-sectional view of the semiconductor structure 100 taken along line X-X as depicted in FIG. 1, FIG. 5B is a cross-sectional view of the semiconductor structure 100 taken along line Y1-Y1 as depicted in FIG. 1, and FIG. 5C is a cross-sectional view of the semiconductor structure 100 taken along line Y2-Y2 as depicted in FIG. 1.

In this embodiment, any known deposition process can be used to deposit a dielectric material (e.g., SiC) above the recessed first semiconductor layer 106 and exposed portions of the STI liner 126 to form the dielectric cap 502. After depositing the dielectric material, a chemical mechanical polishing (CMP) may be conducted until the STI liner 126 to remove excess material and polish upper surfaces of the semiconductor structure 100. Accordingly, after CMP, exposed surfaces of the dielectric cap 502 and STI liner 126 are substantially even or coplanar.

Figure 6A:
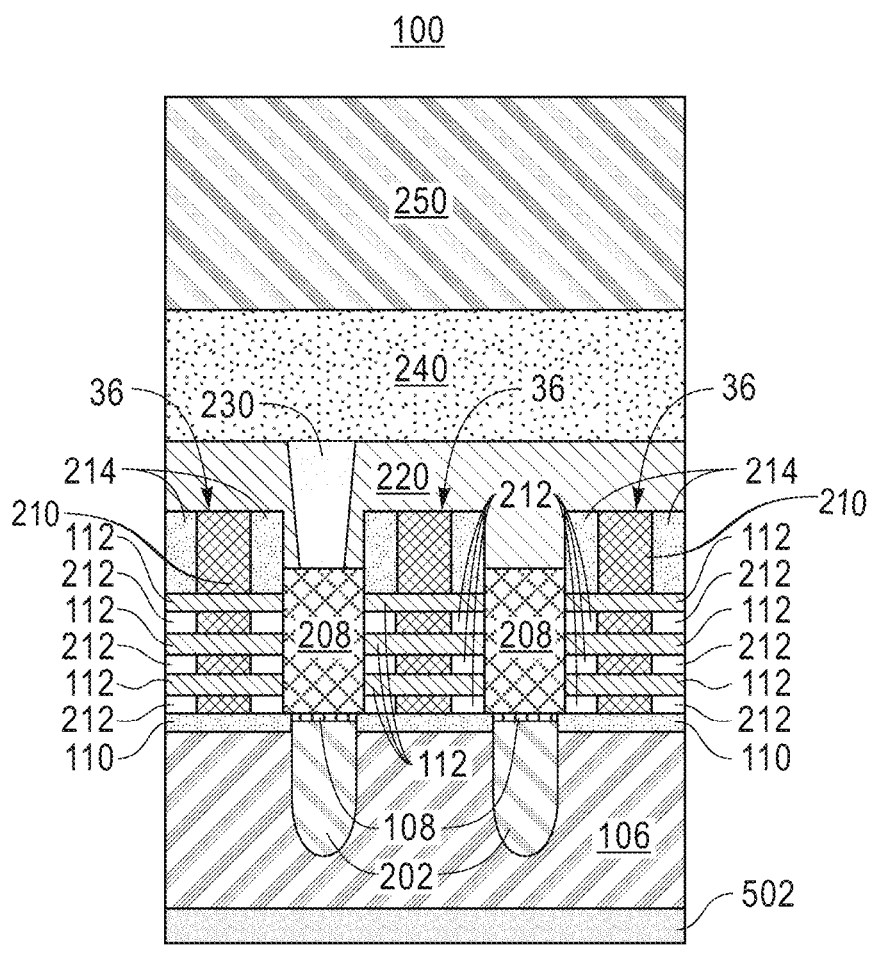
FIG. 6A is a cross-sectional view of the semiconductor structure taken along line X-X as depicted in FIG. 1, shown after conducting an etching process to form a self-aligned backside source/drain cut, according to an embodiment of the present disclosure.
Figures 6B, 6C:
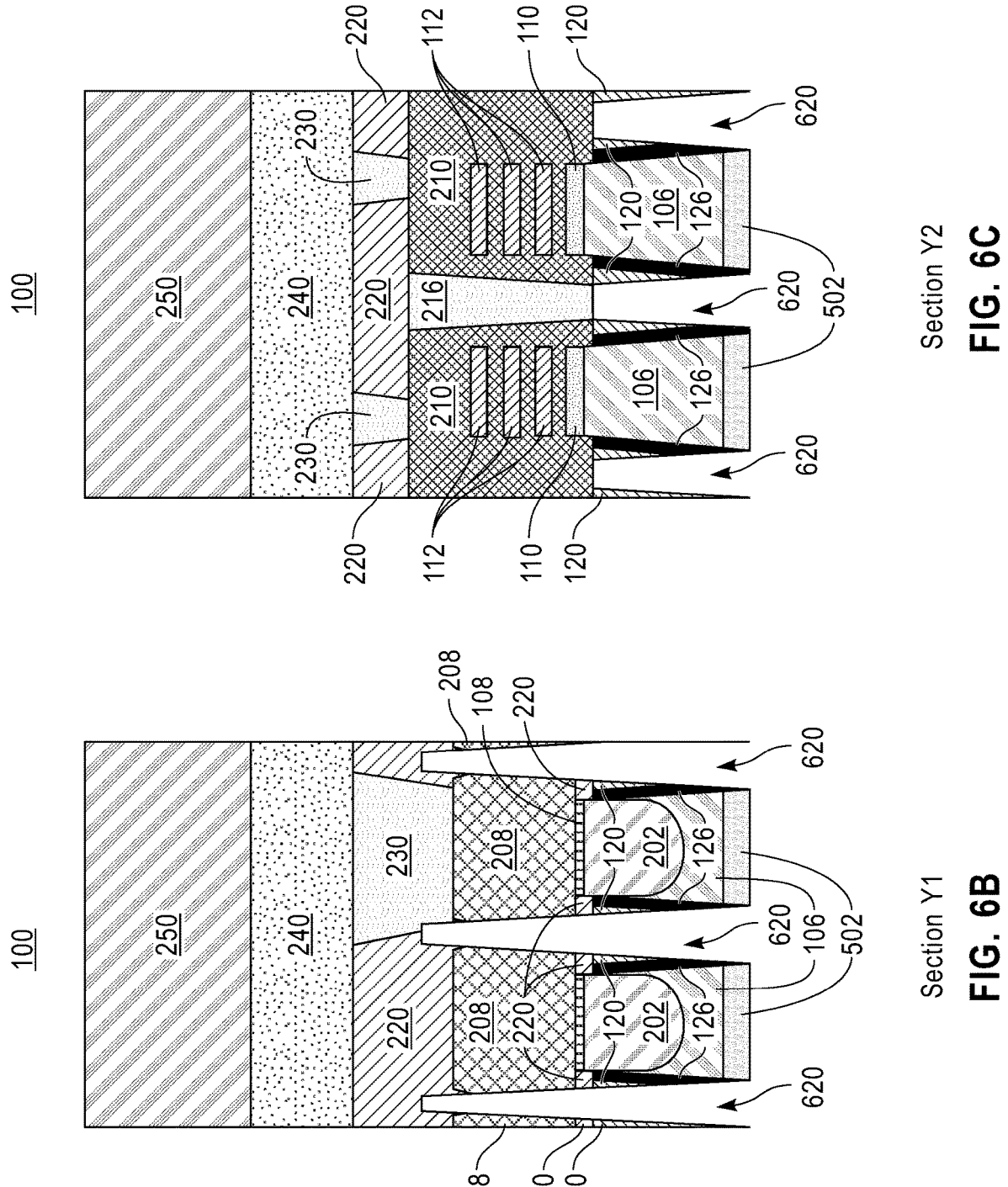
FIG. 6B is a cross-sectional view of the semiconductor structure taken along line Y1-Y1 as depicted in FIG. 1.
FIG. 6C is a cross-sectional view of the semiconductor structure taken along line Y2-Y2 as depicted in FIG. 1.

Referring now to FIGS. 6A-6C, cross-sectional views of the semiconductor structure 100 are shown after conducting an etching process to form a self-aligned backside source/drain cut, according to an embodiment of the present disclosure. In this embodiment, FIG. 6A is a cross-sectional view of the semiconductor structure 100 taken along line X-X as depicted in FIG. 1. FIG. 6B is a cross-sectional view of the semiconductor structure 100 taken along line Y1-Y1 as depicted in FIG. 1, and FIG. 6C is a cross-sectional view of the semiconductor structure 100 taken along line Y2-Y2 as depicted in FIG. 1.

In the depicted embodiment, backside openings 620 are formed within the semiconductor structure 100 by conducting a two-stage etch process. For instance, in this embodiment, the first stage includes conducting a first etch process until a backside region of the gate structure 210 and gate cut region 216, as depicted in FIG. 6C. The first etch process includes, for example, a plasma etch process using $C_4F_8$ chemistry.

With continued reference to FIGS. 6A-6C, the second stage of the two-stage etch process used to form backside openings 620 includes conducting a second etch process selective to the gate structure 210 and gate cut region 216. The second etch process includes, for example, a plasma etch process using $SF_6/CH_2F_2$ or $SF_6/O_2$ chemistry.

By conducting the second etch process, the backside openings 620 are selectively extended through the source/drain regions 208. More particularly, the backside openings 620 cut through adjacent source/drain regions 208 (i.e., source/drain regions 208 of two consecutive nanostructure devices 36) creating a space between these regions that provides the self-aligned backside source/drain cut, as shown in FIG. 6B. In one or more embodiments, the second etch process can be conducted until the backside openings 620 reach the interlevel dielectric layer 220.

Accordingly, in the depicted embodiment, the backside openings 620 are formed by selectively etching portions of the STI regions 120, portions of the STI liner 126, and merged portions of neighboring source/drain regions 208. It should be noted that the tapered STI regions 120 allow the backside openings 620 to be formed with a reverse (or negative) tapered etch profile that narrows in a direction towards the interlevel dielectric layer 220.

Figure 7A:
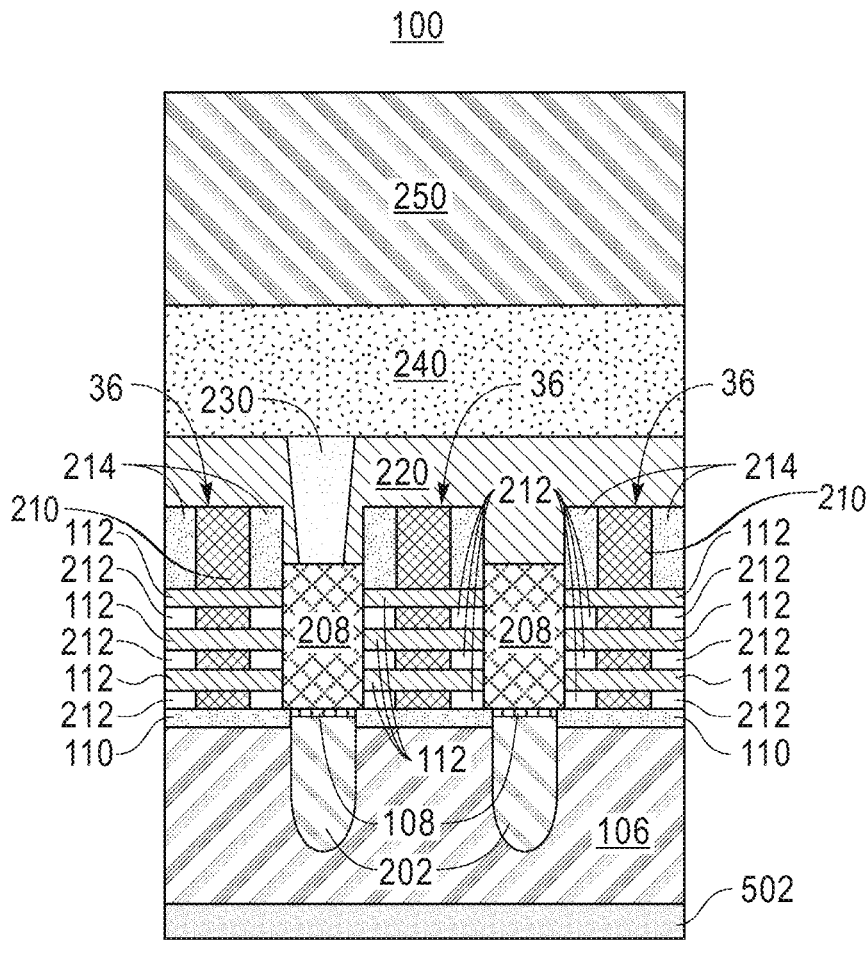
FIG. 7A is a cross-sectional view of the semiconductor structure 100 taken along line X-X as depicted in FIG. 1, shown after forming a backside source/drain cut or isolation region, according to an embodiment of the present disclosure.
Figures 7B, 7C:
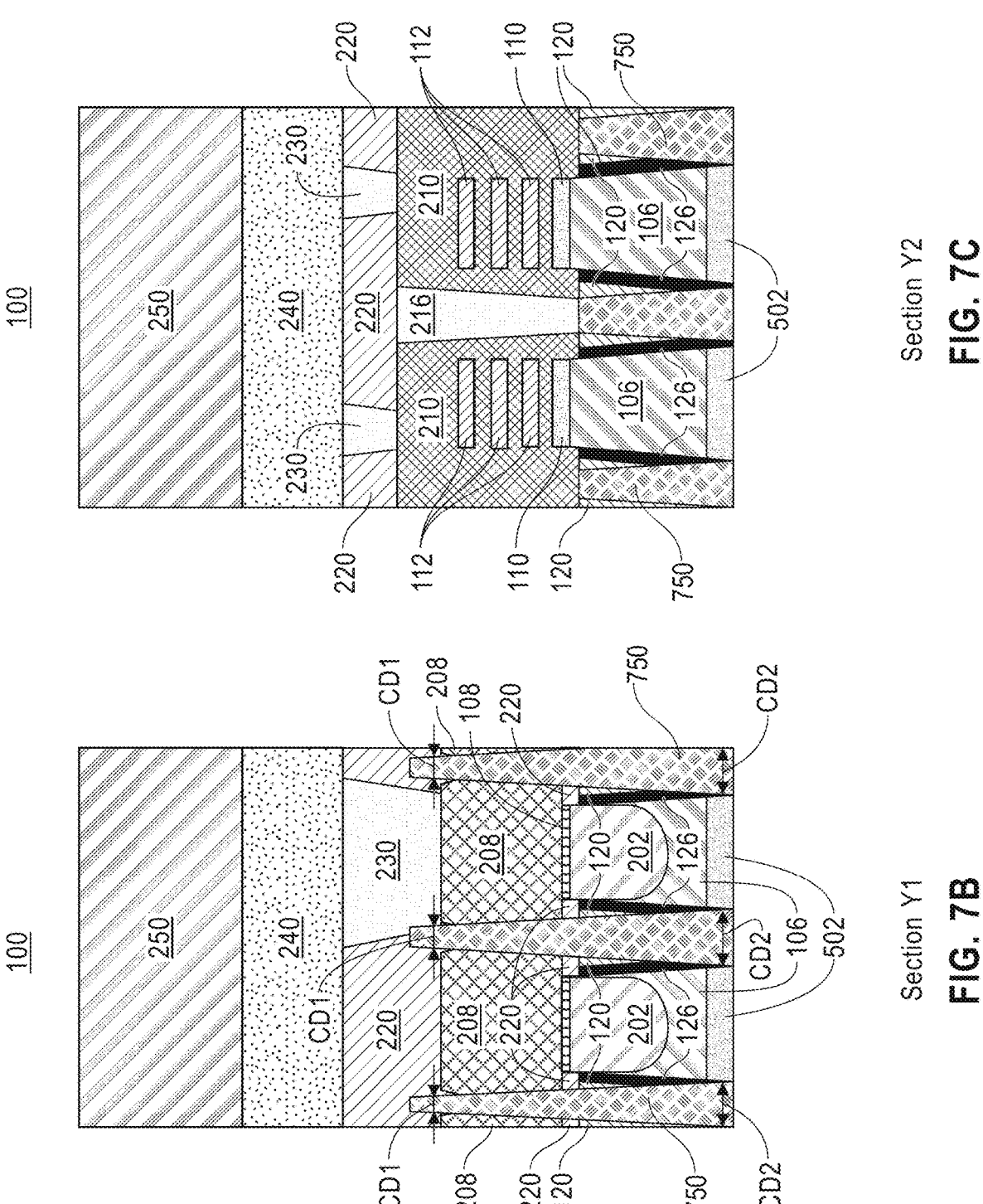
FIG. 7B is a cross-sectional view of the semiconductor structure taken along line Y1-Y1 as depicted in FIG. 1.
FIG. 7C is a cross-sectional view of the semiconductor structure taken along line Y2-Y2 as depicted in FIG. 1.

Referring now to FIGS. 7A-7C, cross-sectional views of the semiconductor structure 100 are shown after forming a backside source/drain cut or isolation region 750, according to an embodiment of the present disclosure. In this embodiment, FIG. 7A is a cross-sectional view of the semiconductor structure 100 taken along line X-X as depicted in FIG. 1, FIG. 7B is a cross-sectional view of the semiconductor structure 100 taken along line Y1-Y1 as depicted in FIG. 1, and FIG. 7C is a cross-sectional view of the semiconductor structure 100 taken along line Y2-Y2 as depicted in FIG. 1.

In this embodiment, a dielectric material can be deposited within the backside openings 620 (FIGS. 6A-6A) to form backside source/drain isolation regions 750 between source/drain regions 208. In an exemplary embodiment, the dielectric material may include silicon nitride and may be deposited using a conformal deposition process (e.g., CVD). The dielectric material fills the narrower portion of the backside openings 620 (FIGS. 6A-6B) extending towards the interlevel dielectric layer 220.

As depicted in FIG. 7B, the backside source/drain isolation regions 750 may include a top portion having a first critical dimension (CD1) and a bottom portion having a second critical dimension (CD2), with CD2 being larger than CD1 (CD2>CD1). This occurs as a result of the backside openings 620 (FIGS. 6A-6C) having a reverse tapered profile, as described above. Thus, the backside source/drain isolation regions 750 have tapering sidewalls formed at an angle narrowing towards the interlevel dielectric layer 220. The backside source/drain isolation regions 750 electrically isolate adjacent (merged) source/drain regions 208.

Figure 8A:
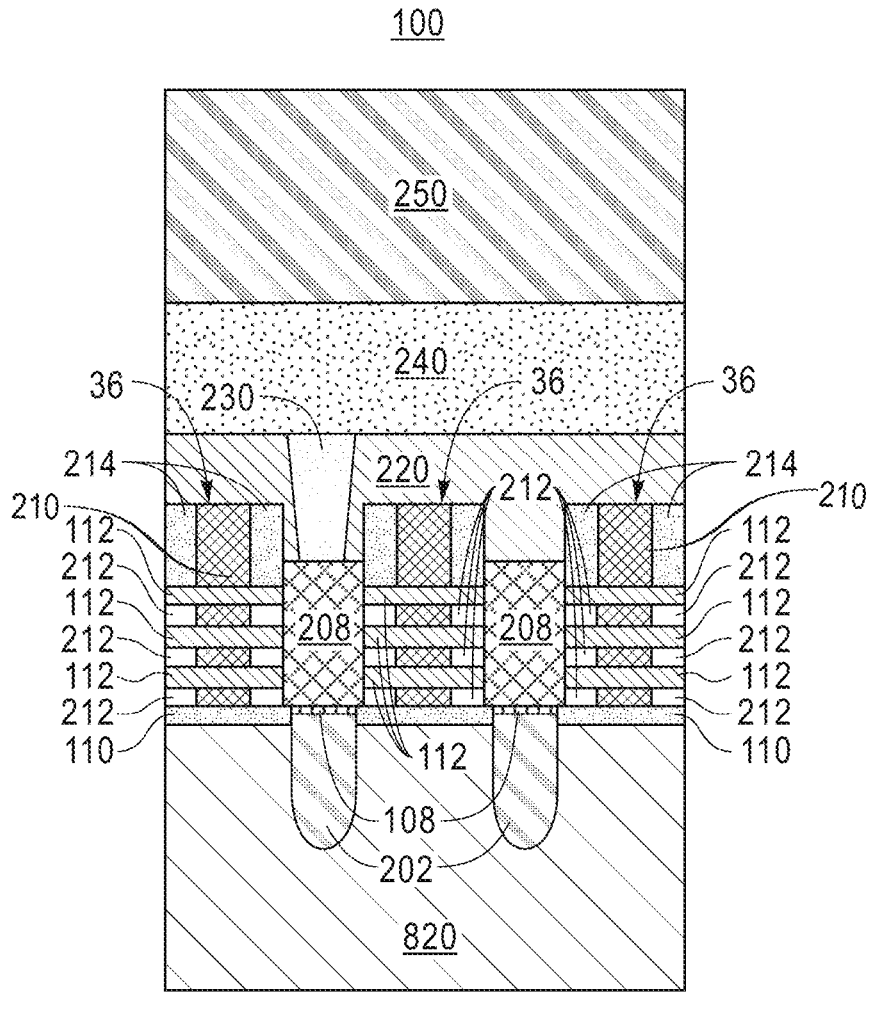
FIG. 8A is a cross-sectional view of the semiconductor structure taken along line X-X as depicted in FIG. 1, shown after removing the dielectric cap and forming a backside interlayer dielectric, according to an embodiment of the present disclosure.
Figures 8B, 8C:
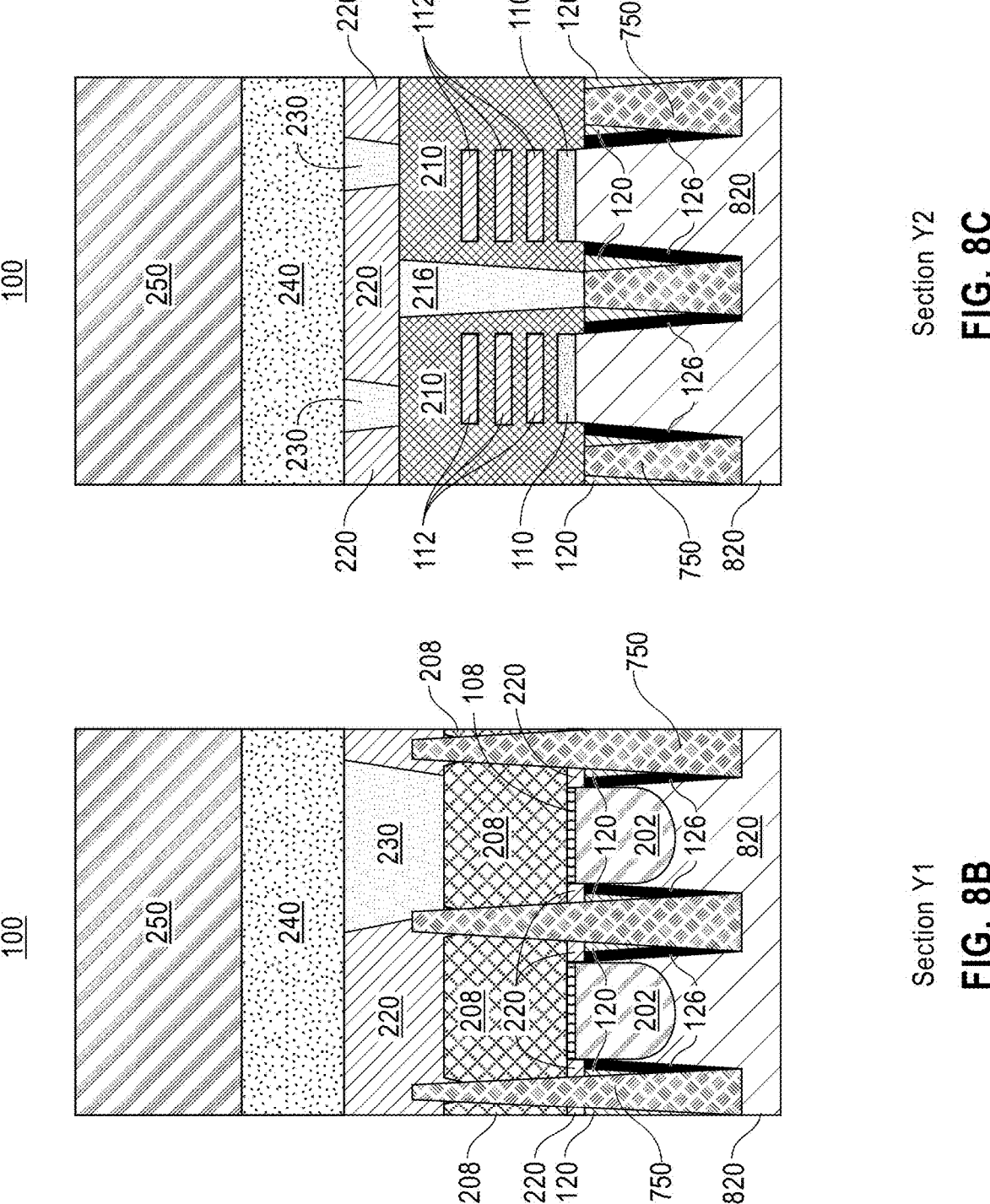
FIG. 8B is a cross-sectional view of the semiconductor structure taken along line Y1-Y1 as depicted in FIG. 1.
FIG. 8C is a cross-sectional view of the semiconductor structure taken along line Y2-Y2 as depicted in FIG. 1.

Referring now to FIGS. 8A-8C, cross-sectional views of the semiconductor structure 100 are shown after removing the dielectric cap 502 and forming a backside interlayer dielectric (BILD) 820, according to an embodiment of the present disclosure. In this embodiment, FIG. 8A is a cross-sectional view of the semiconductor structure 100 taken along line X-X as depicted in FIG. 1, FIG. 8B is a cross-sectional view of the semiconductor structure 100 taken along line Y1-Y1 as depicted in FIG. 1, and FIG. 8C is a cross-sectional view of the semiconductor structure 100 taken along line Y2-Y2 as depicted in FIG. 1.

According to an embodiment, any suitable etching technique can be used to remove the dielectric cap 502 (FIGS. 7A-7C) from the semiconductor structure 100. For example, a plasma etch process based on Cl- and Br-chemistry. can be used to remove the dielectric cap 502.

After removing the dielectric cap 502 (FIGS. 7A-7C), the BILD 820 can be formed using standard methods and materials, such as those used to form the interlevel dielectric layer 220 described above with reference to FIGS. 2A-2C. The BILD 820 is deposited above and in direct contact with the placeholder layer 202, STI liner 126, bottom dielectric isolation layer 110 and backside source/drain isolation regions 750. In an exemplary embodiment, a thickness of the BILD 820 may vary between approximately 40 nm to approximately 300 nm, and ranges therebetween. In one or more embodiments, a planarization process (e.g., CMP) can be conducted on the semiconductor structure 100 after forming the BILD 820.

Figure 9A:
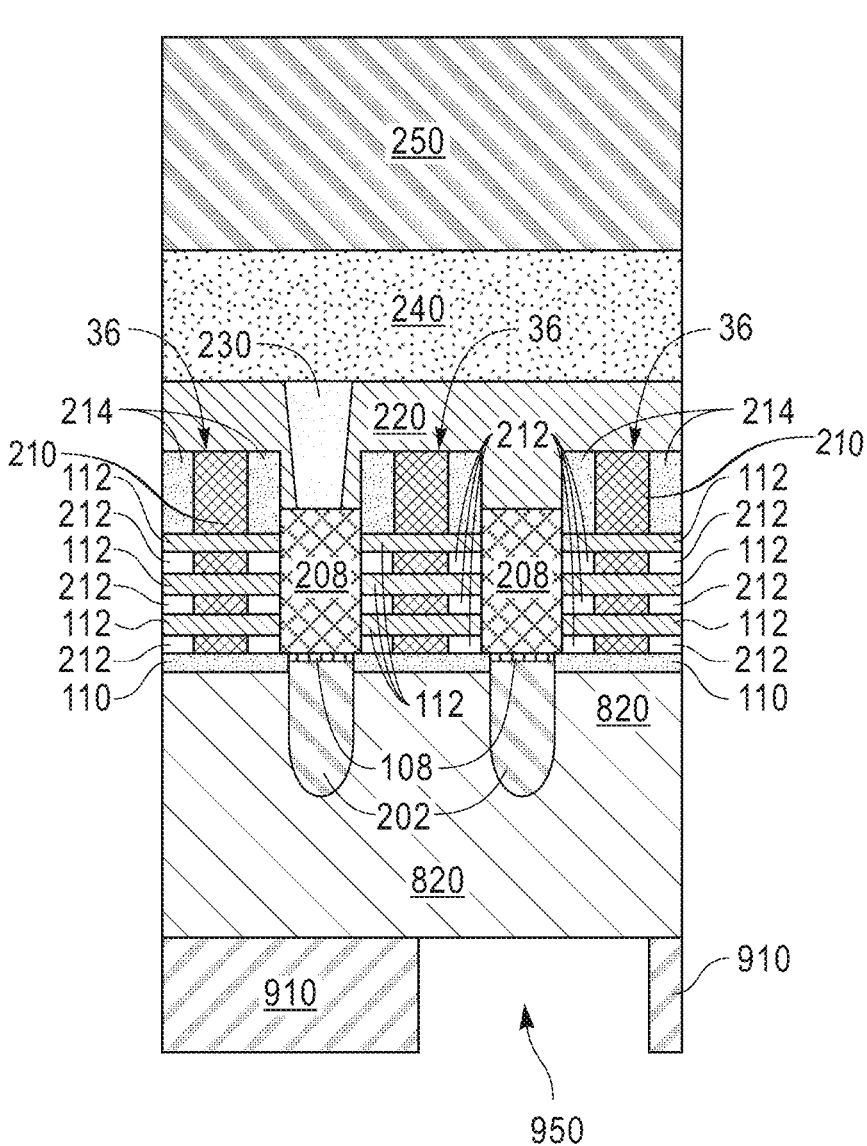
FIG. 9A is a cross-sectional view of the semiconductor structure taken along line X-X, as depicted in FIG. 1, shown after backside contact patterning, according to an embodiment of the present disclosure.
Figures 9B, 9C:
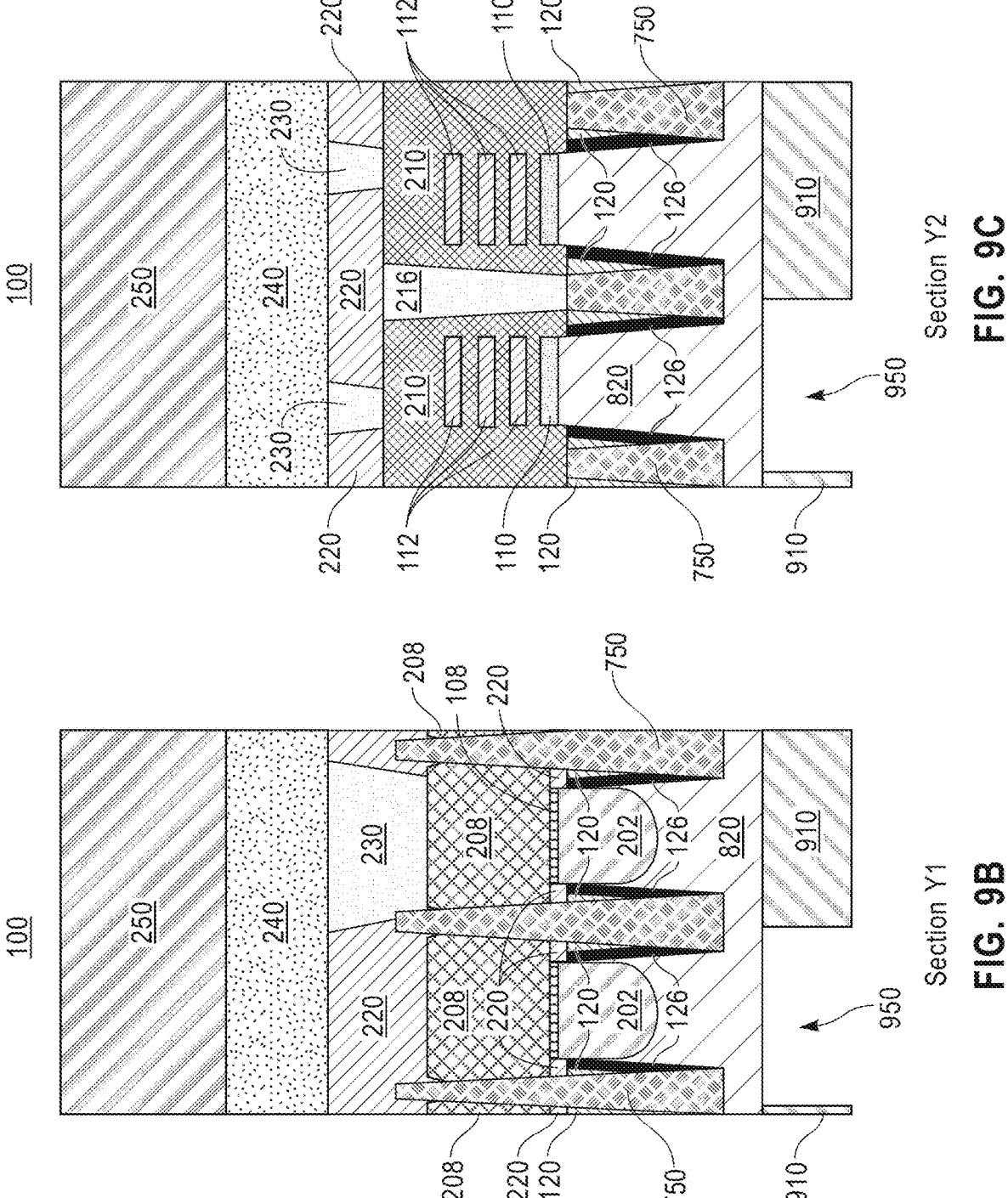
FIG. 9B is a cross-sectional view of the semiconductor structure taken along line Y1-Y1 as depicted in FIG. 1.
FIG. 9C is a cross-sectional view of the semiconductor structure taken along line Y2-Y2 as depicted in FIG. 1.

Referring now to FIGS. 9A-9C, cross-sectional views of the semiconductor structure 100 are shown after backside contact patterning, according to an embodiment of the present disclosure. In this embodiment, FIG. 9A is a cross-sectional view of the semiconductor structure 100 taken along line X-X as depicted in FIG. 1, FIG. 9B is a cross-sectional view of the semiconductor structure 100 taken along line Y1-Y1 as depicted in FIG. 1, and FIG. 9C is a cross-sectional view of the semiconductor structure 100 taken along line Y2-Y2 as depicted in FIG. 1.

According to an embodiment, an organic planarization layer (OPL), or simply planarization layer 910 can be deposited on the semiconductor structure 100. The planarization layer 910 can be made of any organic planarizing material that is capable of effectively preventing damage of underlying layers during subsequent etching processes. The planarization layer 910 can include, but is not necessarily limited to, an organic polymer including C, H, and N. In an embodiment, the organic planarizing material can be free of silicon (Si). In another embodiment, the organic planarizing material can be free of Si and fluorine (F). As defined herein, a material is free of an atomic element when the level of the atomic element in the material is at or below a trace level detectable with analytic methods available in the art. Non-limiting examples of organic planarizing materials for forming the planarization layer 910 may include JSR HM8006, JSR HM8014, AZ UM10M2, Shin Etsu ODL 102, or other similar commercially available materials. The planarization layer 910 may be deposited by, for example, spin coating.

With continued reference to FIGS. 9A-9C, a lithography process followed by an etching process is conducted on the semiconductor structure 100 for etching the planarization layer 910 to form openings 950, as shown in the figure. In some embodiments, etching the planarization layer 910 can be conducted by, for example, an OPL RIE including a trace point detection. In one or more embodiments, a location of the openings 950 can be selected based on the desired location of subsequently formed backside metal contacts.

Figure 10A:
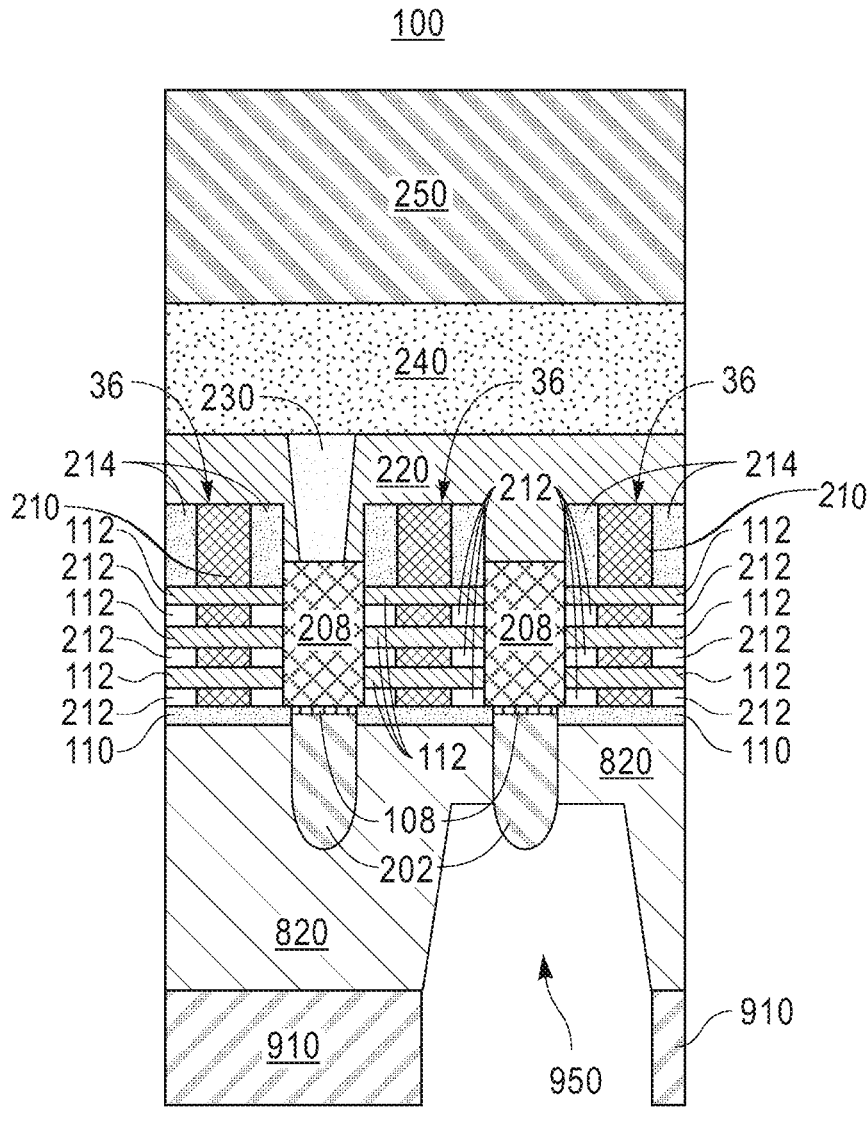
FIG. 10A is a cross-sectional view of the semiconductor structure taken along line X-X, as depicted in FIG. 1, shown after selectively etching the backside interlevel dielectric, according to an embodiment of the present disclosure.
Figures 10B, 10C:
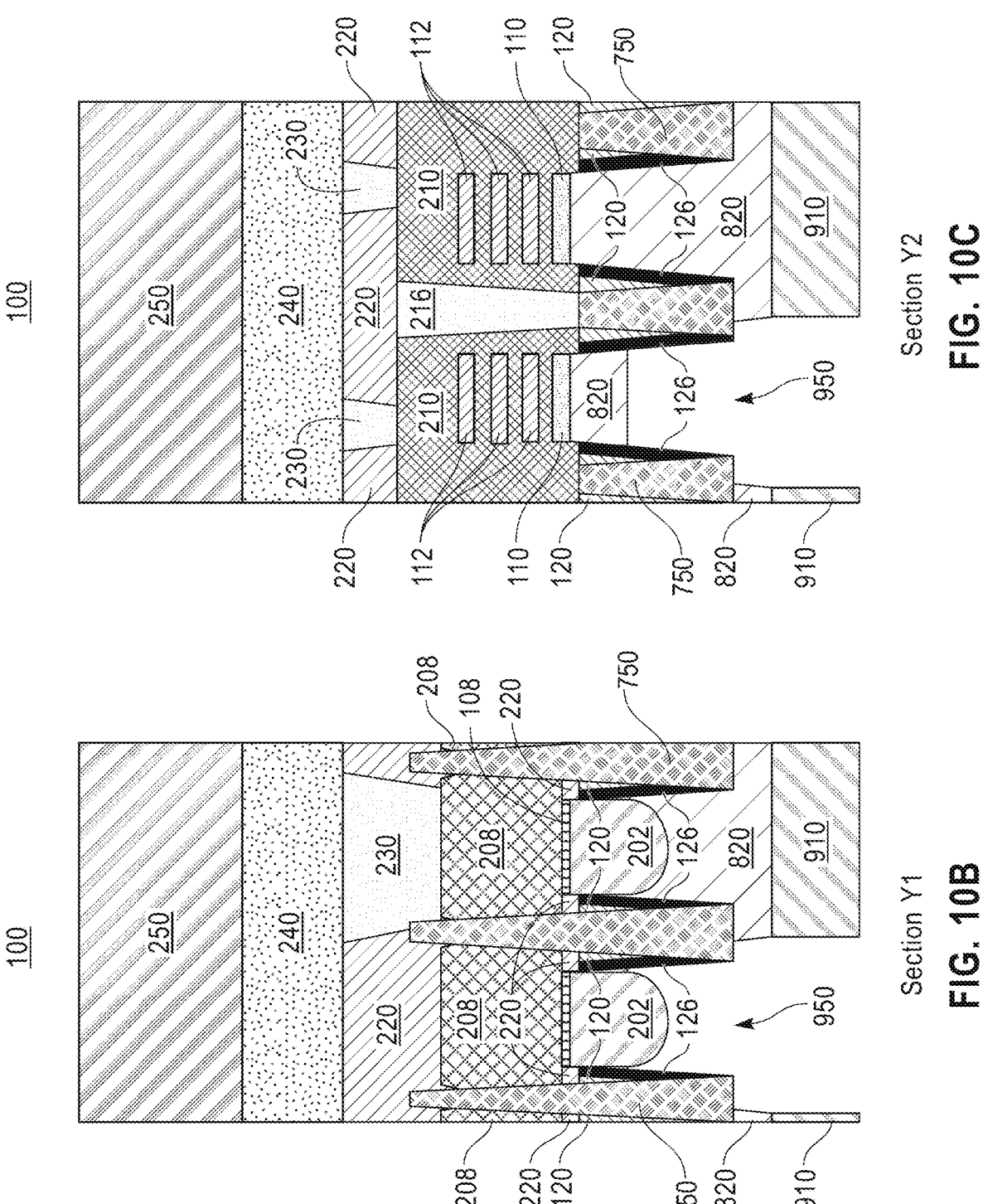
FIG. 10B is a cross-sectional view of the semiconductor structure taken along line Y1-Y1 as depicted in FIG. 1.
FIG. 10C is a cross-sectional view of the semiconductor structure taken along line Y2-Y2 as depicted in FIG. 1.

Referring now to FIGS. 10A-10C, cross-sectional views of the semiconductor structure 100 are shown after selectively etching the BILD 820, according to an embodiment of the present disclosure. In this embodiment, FIG. 10A is a cross-sectional view of the semiconductor structure 100 taken along line X-X as depicted in FIG. 1, FIG. 10B is a cross-sectional view of the semiconductor structure 100 taken along line Y1-Y1 as depicted in FIG. 1, and FIG. 10C is a cross-sectional view of the semiconductor structure 100 taken along line Y2-Y2 as depicted in FIG. 1.

After patterning the planarization layer 910, an etching process can be conducted on the semiconductor structure 100 to remove portions of the BILD 820 selective to the placeholder layer 202, STI liner 126 and backside source/drain isolation regions 750. In an exemplary embodiment, a plasma etch process using C4F4 chemistry can be conducted on the semiconductor structure 100 to remove the BILD 820. As shown in the figures, etching the BILD 820 increases a size of the openings 950 exposing portions of one or more placeholder layers 202. It should be noted that due to the selectivity between the BILD 820 and the STI liner 126 and backside source/drain isolation regions 750, the conducted etching process becomes a self-aligned etch that facilitates the formation of backside contacts.

Figure 11A:
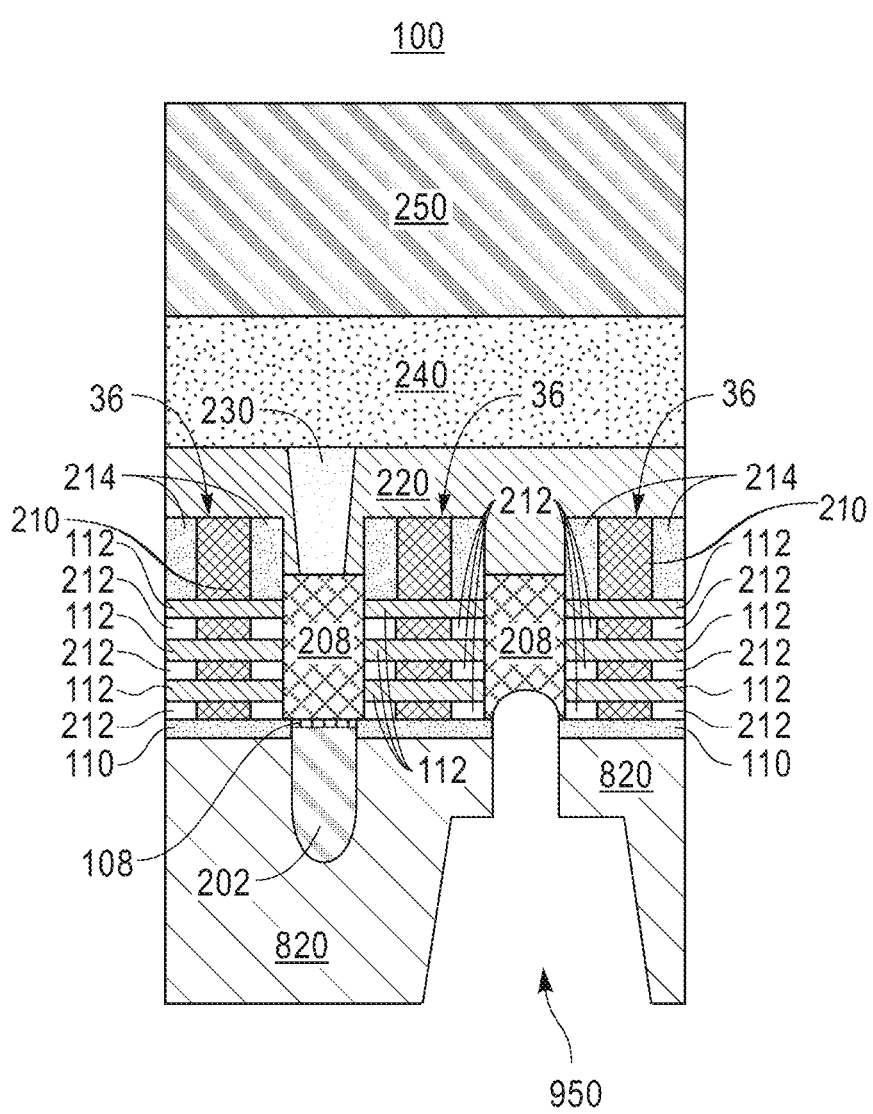
FIG. 11A is a cross-sectional view of the semiconductor structure taken along line X-X, as depicted in FIG. 1, shown after selectively removing a placeholder layer, according to an embodiment of the present disclosure.
Figures 11B, 11C:
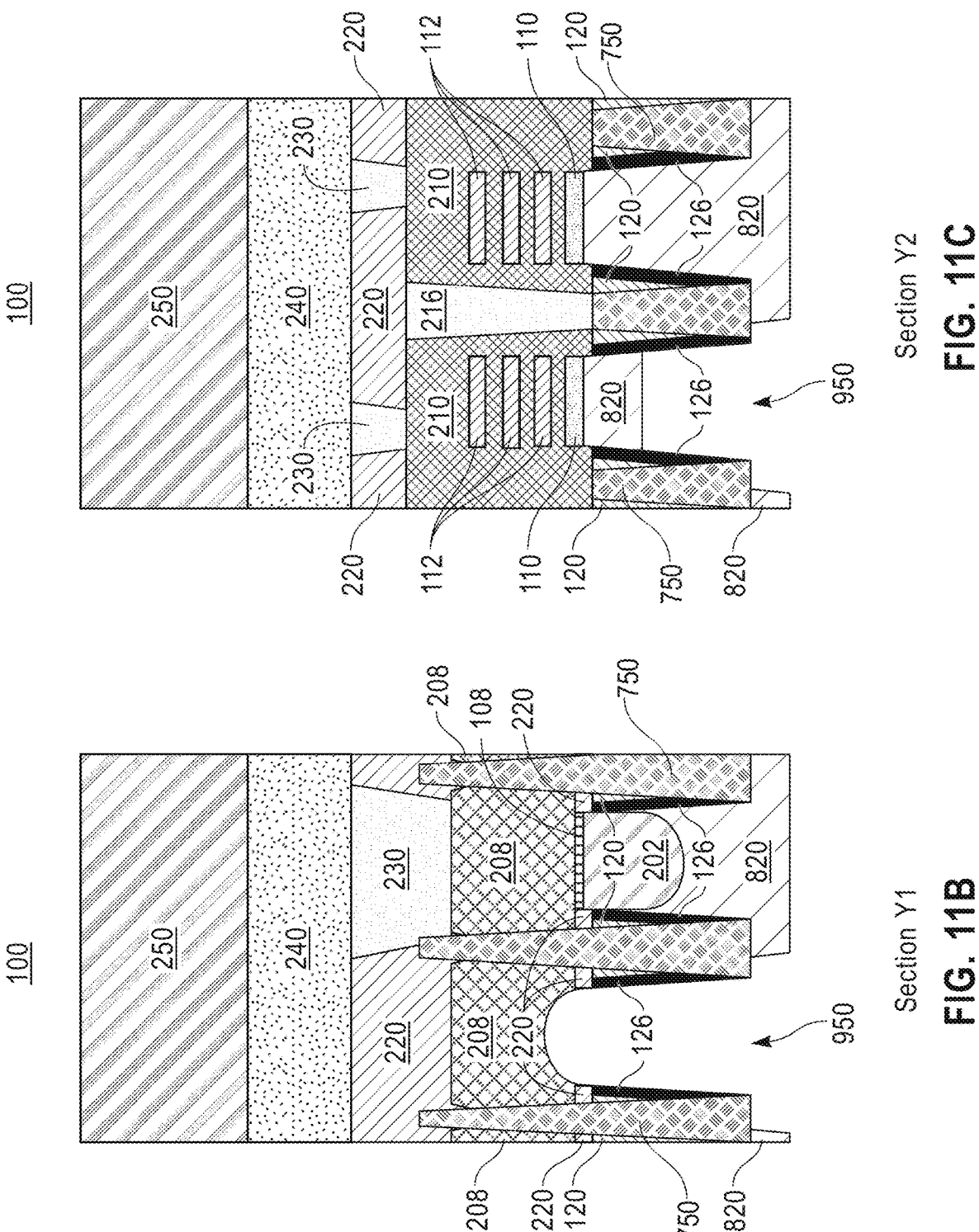
FIG. 11B is a cross-sectional view of the semiconductor structure taken along line Y1-Y1 as depicted in FIG. 1.
FIG. 11C is a cross-sectional view of the semiconductor structure taken along line Y2-Y2 as depicted in FIG. 1.

Referring now to FIGS. 11A-11C, cross-sectional views of the semiconductor structure 100 are shown after selectively removing the placeholder layer 202, according to an embodiment of the present disclosure. In this embodiment, FIG. 11A is a cross-sectional view of the semiconductor structure 100 taken along line X-X as depicted in FIG. 1, FIG. 11B is a cross-sectional view of the semiconductor structure 100 taken along line Y1-Y1 as depicted in FIG. 1, and FIG. 11C is a cross-sectional view of the semiconductor structure 100 taken along line Y2-Y2 as depicted in FIG. 1.

In the depicted embodiment, placeholder layers 202 exposed by the openings 950 can be removed from the semiconductor structure 100. Exemplary techniques suitable for selectively removing the placeholder layers 202 from the semiconductor structure 100 may include, but are not limited to, dry HCl etch which may cause minimal or no damage to the underlying layers.

After removing the placeholder layer 202, the openings 950 (i.e., backside contact vias) expose one or more of the source/drain regions 208, as depicted in FIGS. 1A-11B. More particularly, an area of the one or more source/drain regions 208 exposed by the openings 950 corresponds to a first (bottom) surface of a source/drain region 208 opposing a second (top) surface of the source/drain region 208 that is in contact with the interlevel dielectric layer 220. A portion of the BILD 820 remains above the bottom dielectric isolation layer 110 in the gate region 24 (FIG. 1) of the semiconductor structure 100 depicted in FIG. 11C.

As can be observed in the figures, the openings 650 expose the first surface of at least one source/drain region 208 that is adjacent to at least another source/drain region 208 that is in electric contact with a metal contact 230. It should be noted that the depicted location of openings 950 is for illustration purposes only, it may be understood that different locations can be selected based on design requirements.

Alternatively, or additionally, a via gauging process can be conducted on the semiconductor structure 100 to enhance an interface between openings 950 (i.e., backside contact vias) and subsequently form backside metal layers.

Figure 12A:
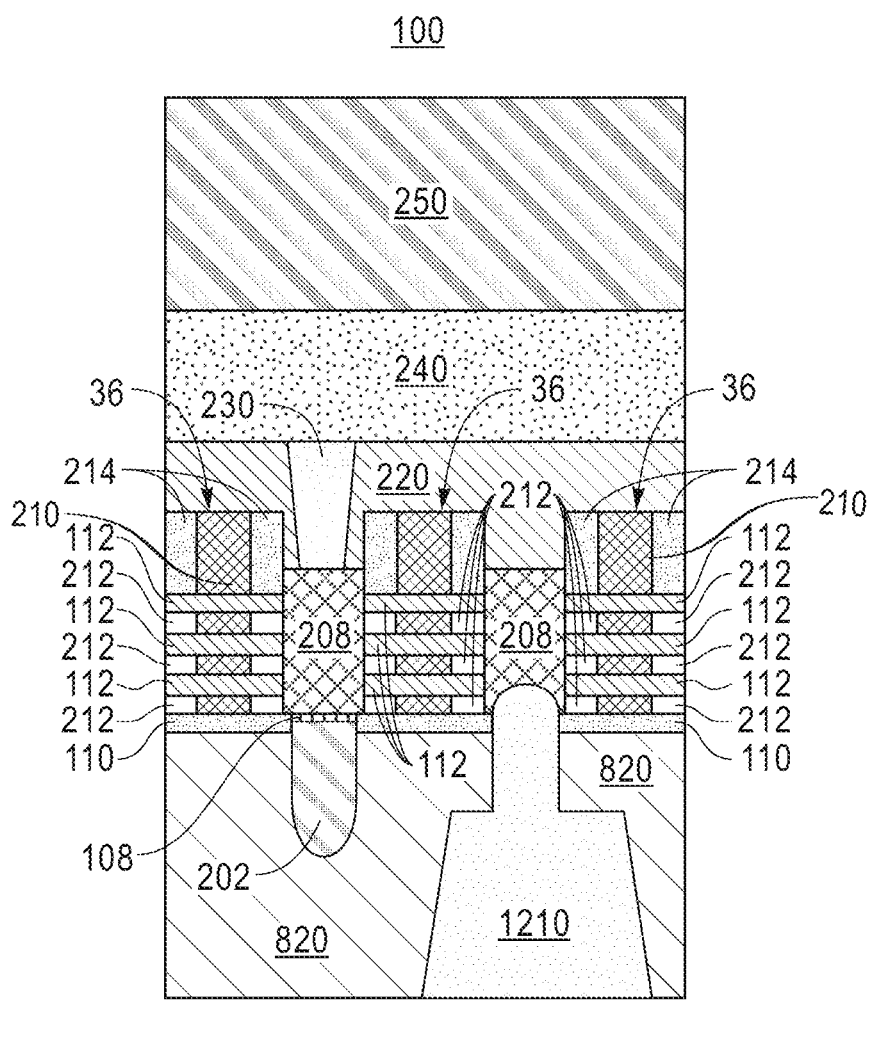
FIG. 12A is a cross-sectional view of the semiconductor structure taken along line X-X, as depicted in FIG. 1, shown after backside contact metallization, according to an embodiment of the present disclosure.
Figures 12B, 12C:
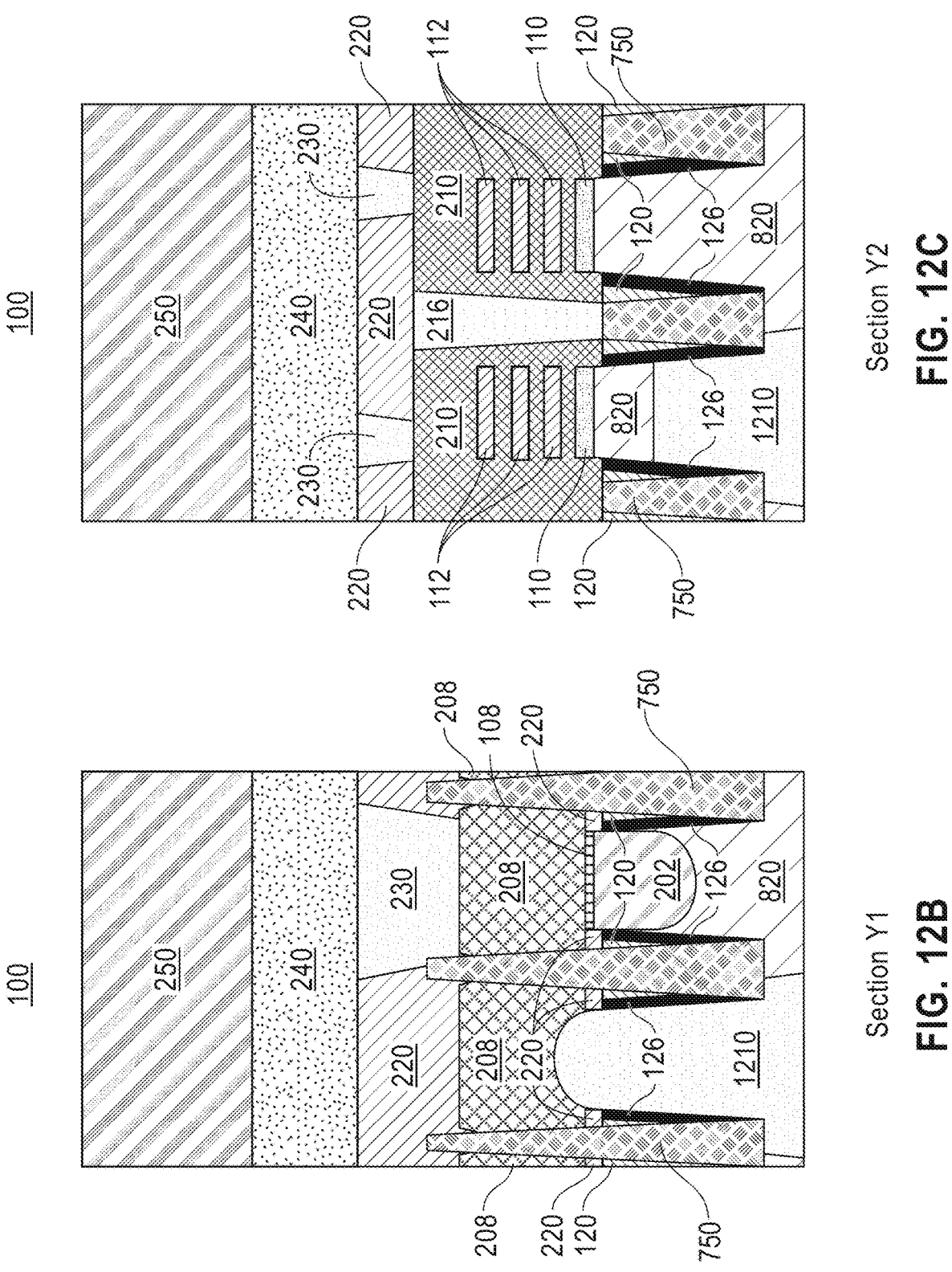
FIG. 12B is a cross-sectional view of the semiconductor structure taken along line Y1-Y1 as depicted in FIG. 1.
FIG. 12C is a cross-sectional view of the semiconductor structure taken along line Y2-Y2 as depicted in FIG. 1.

Referring now to FIGS. 12A-12C, cross-sectional views of the semiconductor structure 100 are shown after backside contact metallization, according to an embodiment of the present disclosure. In this embodiment, FIG. 12A is a cross-sectional view of the semiconductor structure 100 taken along line X-X as depicted in FIG. 1, FIG. 12B is a cross-sectional view of the semiconductor structure 100 taken along line Y1-Y1 as depicted in FIG. 1, and FIG. 12C is a cross-sectional view of the semiconductor structure 100 taken along line Y2-Y2 as depicted in FIG. 1.

According to an embodiment, a backside metal is deposited in the semiconductor structure 100 substantially filling the openings 950 (FIGS. 11A-11C) to form backside metal contacts 1210 to one or more source/drain regions 208. In one or more embodiments, backside metal contacts 1210 can be formed between neighboring source/drain regions 208 located within NFET regions or PFET regions of the semiconductor structure 100. In the depicted embodiment, backside metal contacts 1210 are formed in direct contact with the first (bottom) surface of the one or more source/drain regions 208.

Figure 13A:
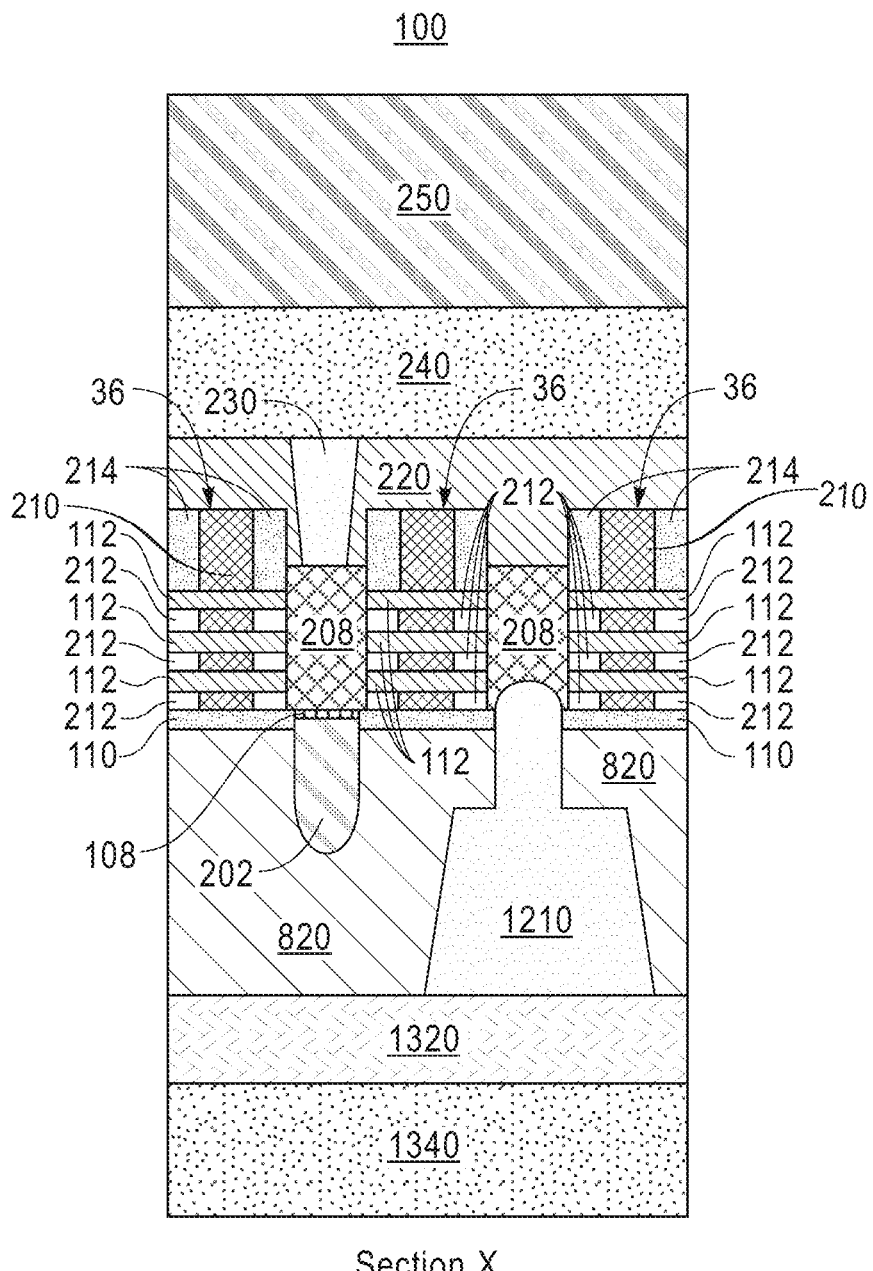
FIG. 13A is a cross-sectional view of the semiconductor structure taken along line X-X as depicted in FIG. 1, shown after backside power rail patterning and metallization and forming a backside power delivery network, according to an embodiment of the present disclosure.
Figures 13B, 13C:
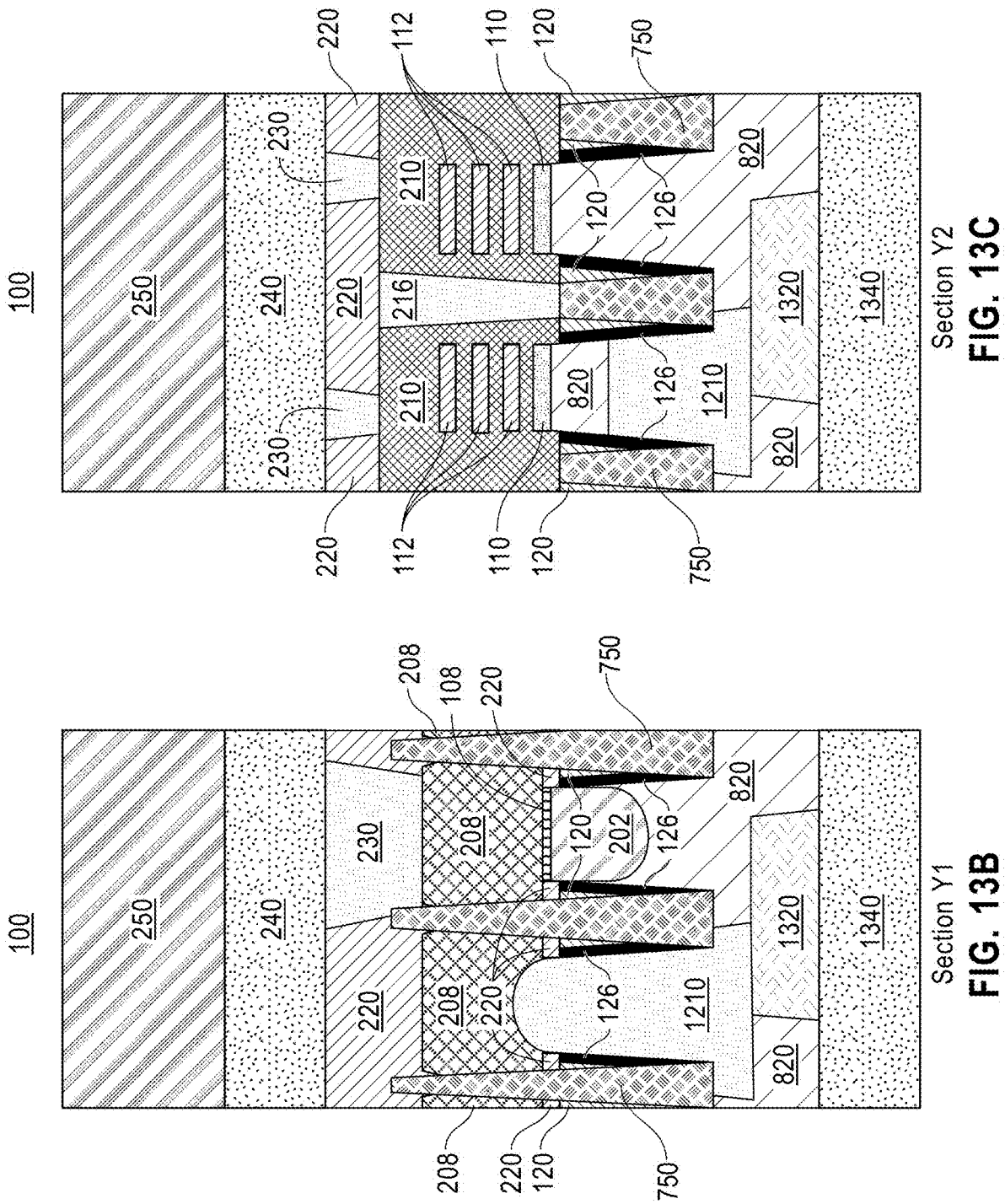
FIG. 13B is a cross-sectional view of the semiconductor structure taken along line Y1-Y1, as depicted in FIG. 1.
FIG. 13C is a cross-sectional view of the semiconductor structure taken along line Y2-Y2 as depicted in FIG. 1.

Referring now to FIGS. 13A-13C, cross-sectional views of the semiconductor structure 100 are shown after backside power rail patterning and metallization and forming a backside power delivery network (BSPDN), according to an embodiment of the present disclosure. In this embodiment, FIG. 13A is a cross-sectional view of the semiconductor structure 100 taken along line X-X as depicted in FIG. 1, FIG. 13B is a cross-sectional view of the semiconductor structure 100 taken along line Y1-Y1 as depicted in FIG. 1, and FIG. 13C is a cross-sectional view of the semiconductor structure 100 taken along line Y2-Y2 as depicted in FIG. 1.

In the depicted embodiment, backside power rails (BPRs) 1320 are formed within a BILD layer substantially similar to the BILD 820. For simplicity, the newly deposited BILD layer is continued to be referred to as BILD 820. The process of forming the BPRs 1320 includes patterning a backside power rail trench (not shown) in the BILD 820, for example, by conventional lithography and reactive ion etching. In the depicted example, the backside power rail trench (not shown) is etched until reaching an uppermost surface of the backside contact 1210. In some embodiments, the aspect ratio of the backside power rail trench (not shown) may be about 0.5 to 5.0.

To form the BPRs 1320, the backside power rail trenches (not shown) can be filled with a conductive metal. The choice of metallization for backside power rails is based on where in the integration flow the rail is formed and metallized. In the depicted embodiment, the BPRs 1320 are formed in the backside of the semiconductor structure 100. In such instances the BPRs 1320 may be formed by depositing, for example, a layer of ruthenium (Ru) or Cu. In other embodiments, the conductive metal forming the BPRs 1320 may include Co, W, Al, and the like. According to an embodiment, the backside BPRs 1320 are electrically connected to one or more backside contacts 1210 for supplying power to devices (e.g., field effect transistors) in the FEOL level 30 (FIGS. 2A-2C).

In embodiments in which the semiconductor structure 100 includes a PFET device, the BPRs 1320 may include a VDD rail embedded in the PFET region of the semiconductor structure 100 that is electrically connected to a (P-type) source/drain region 208 through ac backside contact 1210 (located between adjacent P-type source/drain regions 208). In embodiments in which the semiconductor structure 100 includes an NFET device, the BPRs 1320 may include a VSS rail embedded in the NFET region of the semiconductor structure 100 that is electrically connected to an N-type source/drain region 208 through a backside contact 1210 (located between adjacent N-type source/drain regions 208).

It should be noted that source/drain regions 208 wired to the BPRs 1320 are not connected to the BEOL interconnect level 240. More particularly, as depicted in the figures, at least one BPRs 1320 is electrically connected to a source/drain region 208 of a transistor or nanostructure device 36 through at least one backside contact 1210, with the backside source/drain isolation regions 750 electrically separating adjacent source/drain regions 208.

With continued reference to FIGS. 13A-13C, the structure of the BSPDN 1340 can be made according to known techniques. Depending on the exact function of the transistor arrangement, a number of the source/drain regions 208 may be connected to backside power and ground via the backside contacts 1210.

It should be noted that the BEOL interconnect level 240 in the semiconductor structure 100 manufactured according to the disclosed technology is separated from the BSPDN 1340, thereby increasing the routing resources in the semiconductor structure 100 for signal wirings in the BEOL interconnect level 240.

Thus, according to the proposed embodiments, a semiconductor structure includes a front-end-of-line level including a plurality of field effect transistors. Each field effect transistor includes source/drain regions deposited on opposite sides of the field effect transistors. A shallow trench isolation region is located between adjacent field effect transistors for electrically separating the plurality of field effect transistors from one another. The shallow trench isolation region has a tapered or positive profile. A backside isolation region is embedded within the shallow trench isolation region cutting through the previously merged source/drain regions for electrically isolation the source/drain regions from one another. The backside isolation region has a reverse or negative tapered profile. Preferably, the backside isolation region includes a top portion embedded within the source/drain regions having a first critical dimension and a bottom portion embedded within the shallow trench isolation region having a second critical dimension, with the second critical dimension being larger than the first critical dimension of the backside isolation region.

In one or more embodiments, the shallow trench isolation region further includes a shallow trench isolation liner surrounding a bottom an opposite sidewalls of the shallow trench isolation region. The shallow trench isolation liner is, at least in part, in contact with the bottom portion of the backside isolation region.

The semiconductor structure further includes an interlevel dielectric layer deposited above the field effect transistors and a backside interlevel dielectric dispose below the field effect transistors. A metal contact is formed within the interlevel dielectric layer for electrically connecting a first side of at least one source/drain region to a back-end-of-line level. In a preferred embodiment, a placeholder layer is formed within the backside interlevel dielectric and in contact with a second side of the at least one source/drain region opposing the first side of the at least one source/drain region. A backside metal contact is formed within the backside interlevel dielectric layer for electrically connecting a second side of at least another source/drain region to a backside power rail. A first side of the at least another source/drain region is in contact with the interlevel dielectric layer.

The semiconductor structure further includes a carrier wafer located above the back-end-of-line level and a backside power delivery network deposited above the backside power rail.

In one or more embodiments, each of the field effect transistors includes a gate structure located above and surrounding a plurality of channel layers, the gate structure of a field effect transistor being electrically isolated from the gate structure of an adjacent field effect transistor by a gate cut isolation region. Preferably, the backside isolation region is in contact with the gate cut isolation region in a gate region of the semiconductor structure, as depicted in FIG. 13C.

According to the proposed embodiments, a method of forming the semiconductor structure includes forming a front-end-of-line level including a plurality of field effect transistor with each field effect transistor including source/drain regions deposited on opposite sides of the field effect transistors, forming a shallow trench isolation region between adjacent field effect transistors for electrically separating the plurality of field effect transistors from one another, the shallow trench isolation region having a tapered profile, and forming a backside isolation region embedded within the shallow trench isolation region and cutting through the source/drain regions, the backside isolation region having a reverse tapered profile. The method further includes forming a placeholder layer in contact with a second side of the source/drain regions opposing a first side of the source/drain regions. The placeholder layer being formed within a first semiconductor layer. Preferably, a metal contact is formed within an interlevel dielectric layer deposited above the field effect transistors for electrically connecting the first side of at least one source/drain region to a back-end-of-line level and a carrier wafer is formed above the back-end-of-line level. In an embodiment, each field effect transistor includes a gate structure deposited above and surrounding a plurality of channel layers. The gate structure of a field effect transistor is electrically isolated from the gate structure of an adjacent field effect transistor by a gate cut isolation region.

In one or more embodiments, forming the shallow trench isolation region further includes forming a shallow trench isolation liner surrounding a bottom an opposite sidewalls of the shallow trench isolation region.

The method further includes forming an etch stop sacrificial layer between the first semiconductor layer and a substrate.

In one or more embodiments, forming the backside isolation region further includes removing the substrate and the etch stop layer from the semiconductor structure, recessing the first semiconductor layer to expose the shallow trench isolation liner, and forming a dielectric cap on the recessed first semiconductor layer, with a top surface of the dielectric cap being coplanar with a top surface of the shallow trench isolation liner. The method further includes conducting a first etching process until reaching a surface of the gate structure, the first etching process exposes portions of the gate structure and the gate cut and conducting a second etching process to cut through the source/drain regions.

The method further includes depositing a dielectric filling material within recesses formed after conducting the first etching process and the second etching process, forming a backside interlevel dielectric, conducting a patterning process on the backside interlevel dielectric, selectively removing the placeholder layers from source/drain regions not being electrically connected to the metal contact, depositing a conductive material within the patterned backside interlevel dielectric to form backside metal contacts, forming backside power rails to the backside metal contacts, and forming a backside power delivery network above the backside power rails.

Preferably, the backside isolation region includes a top portion embedded within the source/drain regions having a first critical dimension and a bottom portion embedded within the shallow trench isolation region having a second critical dimension that is larger than the first critical dimension. According to an embodiment, the backside isolation region is in contact with the gate cut isolation region in a gate region of the semiconductor structure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a front-end-of-line level including a plurality of field effect transistors, each field effect transistor including source/drain regions located on opposite sides of the field effect transistors;
a shallow trench isolation region located between adjacent field effect transistors for electrically separating the plurality of field effect transistors from one another, the shallow trench isolation region having a tapered profile; and
a backside isolation region embedded within the shallow trench isolation region and cutting through the source/drain regions, the backside isolation region having a reverse tapered profile.

2. The semiconductor structure of claim 1, wherein the backside isolation region having the reverse tapered profile comprises:
a top portion of the backside isolation region embedded within the source/drain regions having a first critical dimension; and
a bottom portion of the backside isolation region embedded within the shallow trench isolation region having a second critical dimension, wherein the second critical dimension is larger than the first critical dimension.

3. The semiconductor structure of claim 1, further comprising:
a shallow trench isolation liner surrounding a bottom an opposite sidewalls of the shallow trench isolation region.

4. The semiconductor structure of claim 3, wherein the shallow trench isolation liner is, at least in part, in contact with the bottom portion of the backside isolation region.

5. The semiconductor structure of claim 1, further comprising:
an interlevel dielectric layer deposited above the field effect transistors; and
a backside interlevel dielectric dispose below the field effect transistors.

6. The semiconductor structure of claim 5, further comprising:
a metal contact within the interlevel dielectric layer, the metal contact electrically connecting a first side of at least one source/drain region to a back-end-of-line level.

7. The semiconductor structure of claim 6, further comprising:
a placeholder layer within the backside interlevel dielectric, the placeholder layer being located on a second side of the at least one source/drain region opposing the first side of the at least one source/drain region.

8. The semiconductor structure of claim 5, further comprising:
a backside metal contact within the backside interlevel dielectric layer, the backside metal contact electrically connecting a second side of at least another source/drain region to a backside power rail, wherein a first side of the at least another source/drain region is in contact with the interlevel dielectric layer.

9. The semiconductor structure of claim 6, further comprising:
a carrier wafer located above the back-end-of-line level.

10. The semiconductor structure of claim 8, further comprising:
a backside power delivery network deposited above the backside power rail.

11. The semiconductor structure of claim 1, wherein each of the field effect transistors further comprises:
a gate structure located above and surrounding a plurality of channel layers, wherein the gate structure of a field effect transistor is electrically isolated from the gate structure of an adjacent field effect transistor by a gate cut isolation region.

12. The semiconductor structure of claim 11, wherein the backside isolation region is in contact with the gate cut isolation region in a gate region of the semiconductor structure.

*    *    *    *    *